US012635576B2

(12) United States Patent
Kim et al.

(10) Patent No.: US 12,635,576 B2
(45) Date of Patent: May 19, 2026

(54) DISPLAY DEVICE

(71) Applicant: Samsung Display Co., LTD., Yongin-si (KR)

(72) Inventors: Sang Jo Kim, Daejeon (KR); Jin Wan Kim, Hwaseong-si (KR); Seung Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 877 days.

(21) Appl. No.: 18/046,121

(22) Filed: Oct. 12, 2022

(65) Prior Publication Data

US 2023/0114923 A1 Apr. 13, 2023

(30) Foreign Application Priority Data

Oct. 13, 2021 (KR) ........................ 10-2021-0135532

(51) Int. Cl.
*H01L 25/18* (2023.01)
*H10H 29/14* (2025.01)
*H01L 23/00* (2006.01)

(52) U.S. Cl.
CPC .......... *H01L 25/18* (2013.01); *H10H 29/142* (2025.01); *H01L 24/03* (2013.01); *H01L 24/05* (2013.01); *H01L 24/13* (2013.01); *H01L 24/16* (2013.01); *H01L 2224/0361* (2013.01); *H01L 2224/05073* (2013.01); *H01L 2224/05111* (2013.01); *H01L 2224/05124* (2013.01); *H01L 2224/05144* (2013.01); *H01L 2224/05147* (2013.01); *H01L 2224/05573* (2013.01); *H01L 2224/05611* (2013.01); *H01L 2224/05624* (2013.01); *H01L 2224/05644* (2013.01); *H01L*

*2224/05647* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01);
(Continued)

(58) Field of Classification Search
None
See application file for complete search history.

(56) References Cited

U.S. PATENT DOCUMENTS

| | | | |
|---|---|---|---|
| 2016/0308093 A1 | 10/2016 | Miller | |
| 2019/0198561 A1* | 6/2019 | Wildeson | ............. H04B 10/116 |
| 2020/0328327 A1 | 10/2020 | He et al. | |

OTHER PUBLICATIONS

Saha et al., "Monolithic high performance InGaN/GaN white LEDs with a tunnel junction cascaded yellow and blue light-emitting structures" Optical Materials 77 (2018) 104e110; https://doi.org/10.1016/j.optmat.2018.01.021 (7 pages).
(Continued)

*Primary Examiner* — Hung K Vu
(74) *Attorney, Agent, or Firm* — Womble Bond Dickinson (US) LLP

(57) ABSTRACT

A display device comprises a substrate, a plurality of pixel electrodes on the substrate, and a plurality of light emitting elements on the plurality of pixel electrodes, wherein the plurality of light emitting elements include a first light emitting element and a second light emitting element, and each of the first light emitting element and the second light emitting element comprises a first stack configured to emit a first light, a second stack below the first stack and configured to emit a second light or a third light, and tunnel functional layers between the first stack and the second stack.

15 Claims, 36 Drawing Sheets

(52) U.S. Cl.
    CPC .............. *H01L 2224/13166* (2013.01); *H01L 2224/16145* (2013.01); *H01L 2924/0132* (2013.01); *H01L 2924/0133* (2013.01); *H01L 2924/12041* (2013.01)

(56)                References Cited

OTHER PUBLICATIONS

Siekacz et al., "Stack of two III-nitride laser diodes interconnected by a tunnel junction" Optics Express 27(4), Feb. 18, 2019, pp. 5784-5791; https://doi.org/10.1364/OE.27.005784 (8 pages).

* cited by examiner

FIG. 4

ST1: NSM1, MQW1, PSM1
ST2: NSM2, MQW2, PSM2, MQW3

ST1: NSM1, MQW1, PSM1
ST2: NSM2, MQW2, PSM2
ST3: NSM3, MQW3, PSM3

FIG. 26

MP1
PSM2
MQW2 } ST2
NSM2
TUL3
TUL2 } TJ
TUL1
PSM1L
MQW1L
NSM1L
210

FIG. 28

MP2
PSM2
MQW2 } ST2
NSM2
TUL3
TUL2 } TJ
TUL1
PSM1
MQW1 } ST1
NSM1
210

FIG. 30

PSM2
MQW2 } ST2
NSM2 }
TJ
PSM1
MQW1 } ST1
NSM1 }

210

CNE2

CNE1

LE2

LE1

CNE2

CNE1

CCN

DISPLAY DEVICE

CROSS-REFERENCE TO RELATED APPLICATION

This application claims priority to and the benefit of Korean Patent Application No. 10-2021-0135532 filed on Oct. 13, 2021 in the Korean Intellectual Property Office, the entire content of which is incorporated herein by reference.

BACKGROUND

1. Field

One or more embodiments of the present disclosure relate to a display device.

2. Description of the Related Art

As the information society continues to develop, the demand for display devices for displaying images has increased and diversified. The display devices may be flat panel display devices such as liquid crystal displays (LCDs), field emission displays (FEDs), and/or light emitting displays (LEDs). Light emitting display devices may include an organic light emitting display device including an organic light emitting diode element as a light emitting element, an inorganic light emitting display device including an inorganic semiconductor element as a light emitting element, and/or a micro light emitting display device including a micro light emitting diode element as a light emitting element.

Recently, head mounted displays (HMDs) including the light emitting display devices have been developed. The head mounted display (HMD) is a glasses-type monitor device (e.g., a device akin to glasses) for virtual reality (VR) and/or augmented reality (AR) that is worn in the form of glasses or a helmet by a user and forms a focus point in front of a user's eyes at a distance close to the user's eyes.

A high-resolution micro light emitting diode display panel including a micro light emitting diode element may be applied to the head mounted display. Because the micro light emitting diode element emits light of a single color, the micro light emitting diode display panel may include a wavelength conversion layer converting (e.g., configured to convert) a wavelength of light emitted from the micro light emitting diode element in order to display various colors.

SUMMARY

One or more aspects of embodiments of the present disclosure provide for a display device in which a wavelength conversion layer may be omitted and light efficiency may be increased, by emitting light of various wavelength bands from one light emitting element.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to one or more embodiments of the disclosure, a display device comprises a substrate, a plurality of pixel electrodes on the substrate, and a plurality of light emitting elements on the plurality of pixel electrodes, wherein the plurality of light emitting elements include a first light emitting element and a second light emitting element, and each of the first light emitting element and the second light emitting element includes a first stack configured to emit a first light, a second stack below the first stack and configured to emit a second light or a third light, and tunnel functional layers between the first stack and the second stack.

In one or more embodiments, the first stack includes a first active layer configured to emit the first light, and the second stack includes a second active layer configured to emit the second light or the third light.

In one or more embodiments, the first light is blue light, the second light is red light, and the third light is green light.

In one or more embodiments, the first stack includes a first n-type semiconductor layer and a first p-type semiconductor layer spaced apart from each other with the first active layer interposed therebetween, and the second stack includes a second n-type semiconductor layer and a second p-type semiconductor layer spaced apart from each other with the second active layer interposed therebetween.

In one or more embodiments, the tunnel functional layers are between the first stack and the second stack, and include a first tunnel layer including an n-type semiconductor, a second tunnel layer including an n-type semiconductor, and a third tunnel layer including a p-type semiconductor.

In one or more embodiments, the second tunnel layer is between the first tunnel layer and the third tunnel layer, and has a thickness smaller than a thickness of the first tunnel layer and a thickness of the third tunnel layer.

In one or more embodiments, a concentration of a p-type dopant doped in the third tunnel layer is lower than a concentration of an n-type dopant doped in the first tunnel layer and a concentration of an n-type dopant doped in the second tunnel layer.

In one or more embodiments, the first tunnel layer of the tunnel functional layer is in contact with the first p-type semiconductor layer of the first stack, and the third tunnel layer of the tunnel functional layer is in contact with the second n-type semiconductor layer of the second stack.

In one or more embodiments, the first n-type semiconductor layer of the first stack is a common layer continuous in the plurality of light emitting elements.

In one or more embodiments, the display device further comprises a plurality of connection electrodes connecting the plurality of pixel electrodes and the plurality of light emitting elements to each other, wherein the plurality of connection electrodes include a first connection electrode connected to the first p-type semiconductor layer of the first stack, a second connection electrode connected to the second p-type semiconductor layer of the second stack, and a common connection electrode connected to the first n-type semiconductor layer of the first stack.

In one or more embodiments, the first stack is configured to emit the first light according to a first driving current applied to the first connection electrode and the common connection electrode, and the second stack is configured to emit the second light or the third light according to a second driving current applied to the first connection electrode and the second connection electrode.

In one or more embodiments, each of a content of indium in the second active layer of the first light emitting element and a content of indium in the second active layer of the second light emitting element is 30% to 45%, and a current density of the second driving current configured to emit the second light is lower than a current density of the second driving current configured to emit the third light.

According to one or more embodiments of the disclosure, a display device comprises a substrate, a plurality of pixel electrodes on the substrate, and a plurality of light emitting elements on the plurality of pixel electrodes, wherein the plurality of light emitting elements include a first light emitting element including active layers each configured to emit different light, and a second light emitting element and a third light emitting element including active layers each configured to emit different light or the same light, and each of the first light emitting element, the second light emitting element, and the third light emitting element further includes a tunnel functional layer between the active layers.

In one or more embodiments, the first light emitting element includes a first active layer configured to emit a first light and a second active layer configured to emit a second light, the first light is blue light, and the second light is red light.

In one or more embodiments, each of the second light emitting element and the third light emitting element includes a third active layer configured to emit the second light or a third light, and a second active layer configured to emit the second light or the third light.

In one or more embodiments, the third active layer of each of the second light emitting element and the third light emitting element is configured to emit the second light or the third light, and the second active layer of each of the second light emitting element and the third light emitting element is configured to emit the second light.

In one or more embodiments, each of a content of indium in the second active layer and a content of indium in the third active layer is 30% to 45%, and a current density of a second driving current configured to emit the second light is lower than a current density of a second driving current configured to emit the third light.

In one or more embodiments, the tunnel functional layer is between the first active layer and the second active layer of the first light emitting element and between the second active layer and the third active layer of the second light emitting element, and includes a first tunnel layer including an n-type semiconductor, a second tunnel layer including an n-type semiconductor, and a third tunnel layer including a p-type semiconductor.

In one or more embodiments, the second tunnel layer is between the first tunnel layer and the third tunnel layer and has a thickness smaller than a thickness of the first tunnel layer and a thickness of the third tunnel layer, and a concentration of a p-type dopant doped in the third tunnel layer is lower than a concentration of an n-type dopant doped in the first tunnel layer and a concentration of an n-type dopant doped in the second tunnel layer.

According to one or more embodiments of the disclosure, a display device comprises a substrate, a plurality of pixel electrodes on the substrate, and a plurality of light emitting elements on the plurality of pixel electrodes, wherein the plurality of light emitting elements include a first light emitting element including a first stack configured to emit a first light, a second stack configured to emit the first light, and tunnel functional layers between the first stack and the second stack, a second light emitting element configured to emit a second light, and a third light emitting element configured to emit a third light.

In one or more embodiments, the first light emitting element includes a first active layer configured to emit a first light and a second active layer configured to emit a second light, the second light emitting element includes a third active layer configured to emit the second light, the third light emitting element includes a fourth active layer configured to emit the third light, the first light is red light, the second light is green light, and the third light is blue light.

In one or more embodiments, the tunnel functional layer includes a first tunnel layer including an n-type semiconductor, a second tunnel layer including an n-type semiconductor, and a third tunnel layer including a p-type semiconductor, the second tunnel layer is between the first tunnel layer and the third tunnel layer and has a thickness smaller than a thickness of the first tunnel layer and a thickness of the third tunnel layer, and a concentration of a p-type dopant doped in the third tunnel layer is lower than a concentration of an n-type dopant doped in the first tunnel layer and a concentration of an n-type dopant doped in the second tunnel layer.

In the display device according to embodiments, each of a plurality of pixels may display various colors without a wavelength conversion layer by including a first light emitting element configured to emit first light and second light and a second light emitting element configured to emit the first light and the second light or the first light and third light. In addition, a plurality of light emitting elements may emit the second light or the third light to improve efficiency of the second light or the third light.

In the display device according to embodiments, it is possible to improve light efficiency by adjusting a current density of a driving current applied to the same active layer of the respective light emitting elements to selectively emit the second light or the third light.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in more detail embodiments thereof with reference to the attached drawings, in which:

FIG. 4 is a cross-sectional view illustrating an example of a display panel taken along line Q1-Q1' of FIG. 2;

FIG. 15 is a cross-sectional view illustrating a display device according to one or more other embodiments;

FIG. 19 is a cross-sectional view illustrating a display device according to one or more other embodiments;

FIG. 21 is a cross-sectional view illustrating a display device according to one or more other embodiments;

FIGS. 24 to 32 are cross-sectional views for describing acts of the method of manufacturing a display device according to one or more embodiments;

DETAILED DESCRIPTION

Figure 1:
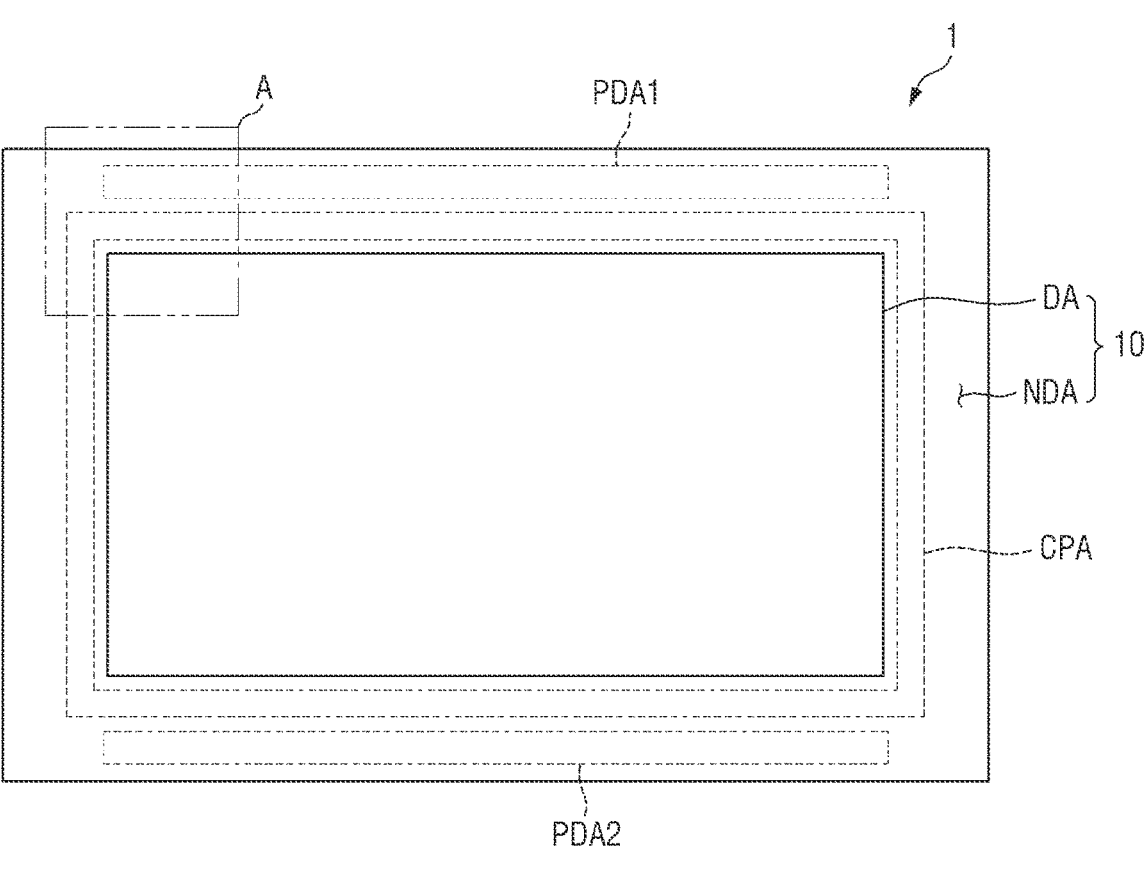
FIG. 1 is a layout diagram illustrating a display device according to one or more embodiments in a plan view.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification and drawings.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise.

As used herein, the term "and/or" includes any and all combinations of one or more of the associated listed items. Further, the use of "may" when describing embodiments of the present disclosure refers to "one or more embodiments of the present disclosure."

As used herein, expressions such as "at least one of, "one of", and "selected from," when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The device and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

Figure 2:
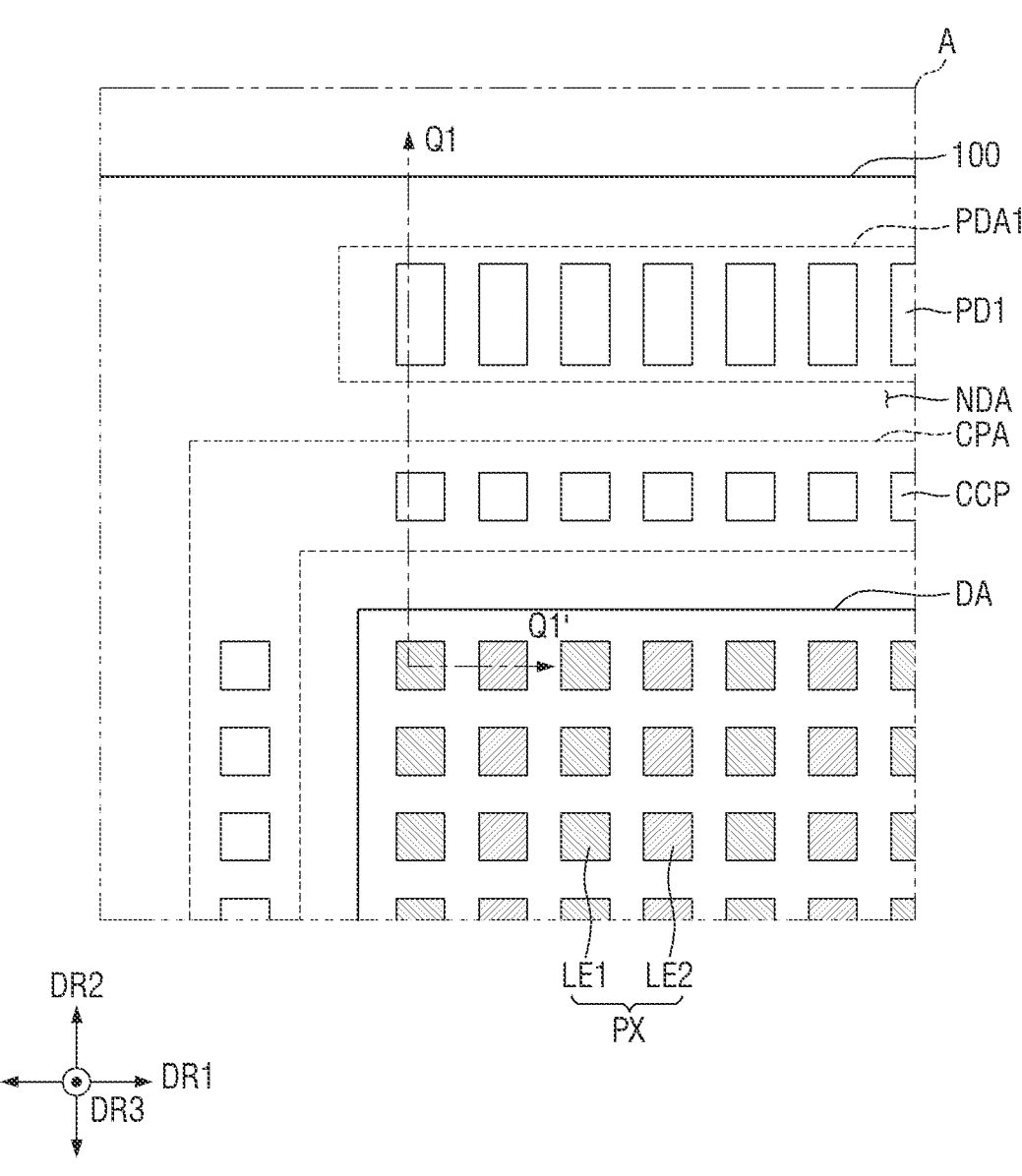
FIG. 2 is a layout diagram illustrating region A of FIG. 1 in more detail.
Figure 3:
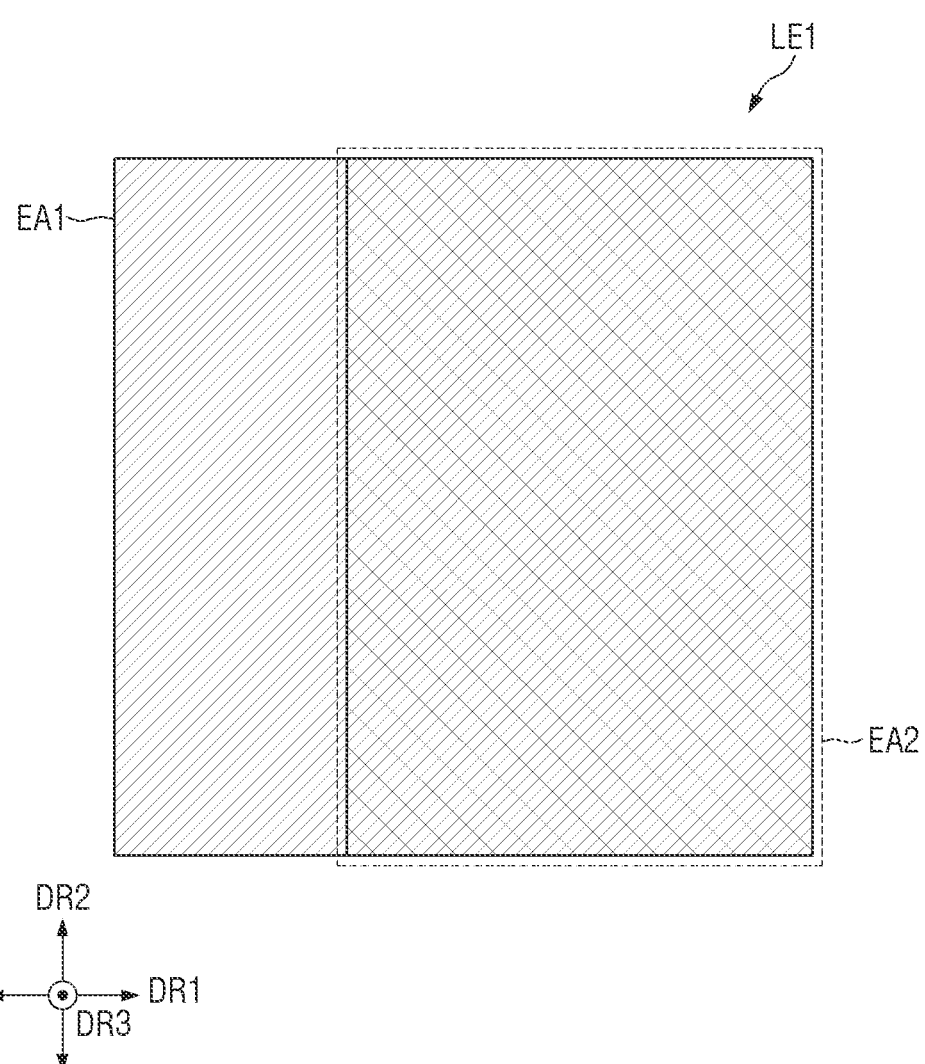
FIG. 3 is a plan view illustrating one pixel according to one or more embodiments.

FIG. 1 is a layout diagram illustrating a display device according to one or more embodiments in a plan view. FIG. 2 is a layout diagram illustrating region A of FIG. 1 in more detail. FIG. 3 is a plan view illustrating one pixel according to one or more embodiments.

It will be mainly described in FIGS. 1 to 3 that a display device according to one or more embodiments is a micro light emitting diode display device including a micro light emitting diode as a light emitting element, but one or more embodiments of the present disclosure are not limited thereto.

In addition, it will be mainly described in FIGS. 1 to 3 that the display device according to one or more embodiments is a Light Emitting Diode on Silicon (LEDoS) in which light emitting diode elements are arranged on a semiconductor circuit substrate formed using a semiconductor process, but it is to be noted that one or more embodiments of the present disclosure are not limited thereto.

In FIGS. 1 to 3, a first direction DR1 refers to a transverse direction of a display panel 10, a second direction DR2 refers to a longitudinal direction of the display panel 10, and a third direction DR3 refers to a thickness direction of the display panel 10. In this case, "left", "right", "upper", and "lower" refer to directions when the display panel 10 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2. In addition, "upper portion" refers to one side in the third direction DR3, and "lower portion" refers to the other side in the third direction DR3.

Referring to FIGS. 1 to 3, a display device 1 according to one or more embodiments includes a display panel 10 including a display area DA and a non-display area NDA.

The display panel 10 may have a rectangular shape, in a plan view, having long sides in the first direction DR1 and short sides in the second direction DR2. However, the shape of the display panel 10 in a plan view is not limited thereto, and the display panel 10 may have a polygonal, circular, elliptical, and/or irregular shape in a plan view, other than the rectangular shape.

The display area DA may be an area in which an image is displayed, and the non-display area NDA may be an area in which an image is not displayed. A shape of the display area DA in a plan view may follow the shape of the display panel 10 in a plan view. It has been illustrated in FIG. 1 that the shape of the display area DA in a plan view is a rectangular shape. The display area DA may be positioned in a central area of the display panel 10. The non-display area NDA may be around the display area DA. The non-display area NDA may surround the display area DA.

The display area DA of the display panel 10 may include a plurality of pixels PX. The pixel PX includes a plurality of light emitting elements, and may be defined as a minimum light emitting unit capable of displaying white light by combining light emitted from the plurality of light emitting elements.

Each of the plurality of pixels PX may include first and second light emitting elements LE1 and LE2 that emit light. The first light emitting element LE1 may emit first light and second light, and the second light emitting element LE2 may emit first light and third light. Each of the plurality of pixels PX may include emission areas EA1 and EA2 that emit light. It has been illustrated in one or more embodiments of the present disclosure that each of the plurality of pixels PX includes two emission areas EA1 and EA2, but the present disclosure is not limited thereto. It has been illustrated that each of the light emitting elements LE1 and LE2 has a rectangular shape in a plan view, but one or more embodiments of the present disclosure are not limited thereto. For example, each of the light emitting elements LE1 and LE2 may have a polygonal, circular, elliptical, and/or irregular shape, other than the rectangular shape.

In the display area DA, the first light emitting elements LE1 and the second light emitting elements LE2 may be alternately positioned with each other in the first direction DR1 and the second direction DR2. For example, the first light emitting elements LE1 and the second light emitting elements LE2 may be arranged in a stripe shape. As illustrated in FIG. 2, an area of the first light emitting element LE1 and an area of the second light emitting element LE2 may be substantially the same as each other, but are not limited thereto. For example, the area of the first light emitting element LE1 and the area of the second light emitting element LE2 may also be different from each other.

A first emission area EA1 refers to an area emitting (e.g., configured to emit) the first light. Each of the first emission areas EA1 may emit the first light emitted from the first light emitting element LE1 as it is. The first light may be light of a blue wavelength band. The blue wavelength band may be at approximately 370 nm to 460 nm, but one or more embodiments of the present disclosure are not limited thereto.

A second emission area EA2 refers to an area emitting (e.g., configured to emit) the second light or the third light. The second emission area EA2 may emit the second light emitted from the first light emitting element LE1 as it is or may emit the third light emitted from the second light emitting element LE2 as it is. The second light may be light of a red wavelength band. The red wavelength band may be at approximately 600 nm to 750 nm, but one or more embodiments of the present disclosure are not limited thereto. The third light may be light of a green wavelength band. The green wavelength band may be at approximately 480 nm to 560 nm, but one or more embodiments of the present disclosure are not limited thereto.

In each of the light emitting elements LE1 and LE2, a first stack ST1 corresponding to the first emission area EA1 and a second stack ST2 corresponding to the second emission area EA2 may be sequentially stacked and arranged in a direction opposite to the third direction DR3. For example, in the first light emitting element LE1, the first stack ST1 corresponding to the first emission area EA1 may be at the uppermost portion, and the second stack ST2 corresponding to the second emission area EA2 may be below the first stack ST1 in the third direction DR3.

The first emission area EA1 may have the same area as the entire size of the first light emitting element LE1. The second emission area EA2 may have an area smaller than that of the first emission area EA1. However, the present disclosure is not limited thereto, and the area of the second emission area EA2 may be greater than that of the first emission area EA1.

It has been illustrated in FIGS. 2 to 3 that each of the emission areas EA1 and EA2 has a rectangular shape in a plan view, but one or more embodiments of the present disclosure are not limited thereto. For example, each of the emission areas EA1 and EA2 may have a polygonal, circular, elliptical, and/or irregular shape, other than the rectangular shape.

The non-display area NDA may include a first pad part PDA1 and a second pad part PDA2.

The first pad part PDA1 may be in the non-display area NDA. The first pad part PDA1 may be on an upper side of the display panel 10. The first pad part PDA1 may include first pads PD1 connected (e.g., electrically coupled) to an external circuit board CB (see e.g., FIG. 4).

The second pad part PDA2 may be in the non-display area NDA. The second pad part PDA2 may be on a lower side of a semiconductor circuit substrate 100. The second pad part PDA2 may include second pads to be connected (e.g., electrically coupled) to the external circuit board CB (see e.g., FIG. 4). In some embodiments, the second pad part PDA2 may not be provided.

In one or more embodiments, the non-display area NDA may further include a common electrode connection part CPA surrounding the display area DA.

The common electrode connection part CPA may be in the non-display area NDA, and may be between the first pad part PDA1 and the display area DA and between the second pad part PDA2 and the display area DA. In addition, the common electrode connection part CPA may be on one side and the other side (e.g., right and left sides) of the display area DA in the first direction DR1, and may be on one side and the other side of the display area DA in the second direction DR2. The common electrode connection part CPA may include a plurality of connection electrodes CCP to be connected (e.g., electrically coupled) to the semiconductor circuit substrate.

It has been illustrated in FIG. 1 that the common electrode connection part CPA completely surrounds the display area DA (e.g., surrounds an entire periphery of the display area DA), but one or more embodiments of the present disclosure are not limited thereto. For example, the common electrode connection part CPA may also be on just one side, both sides, or at least three sides of the display area DA.

Figure 4:
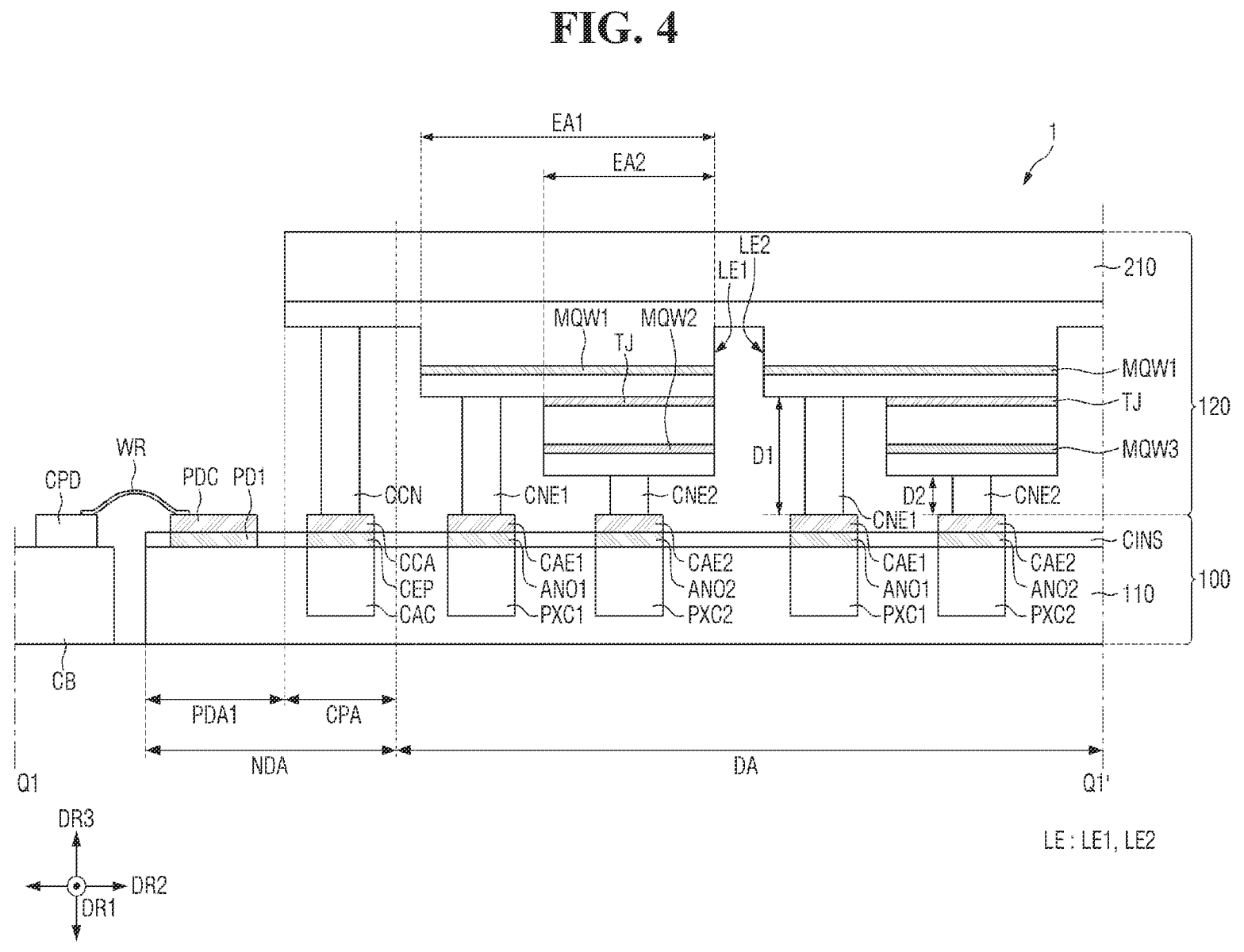
Figure 5:
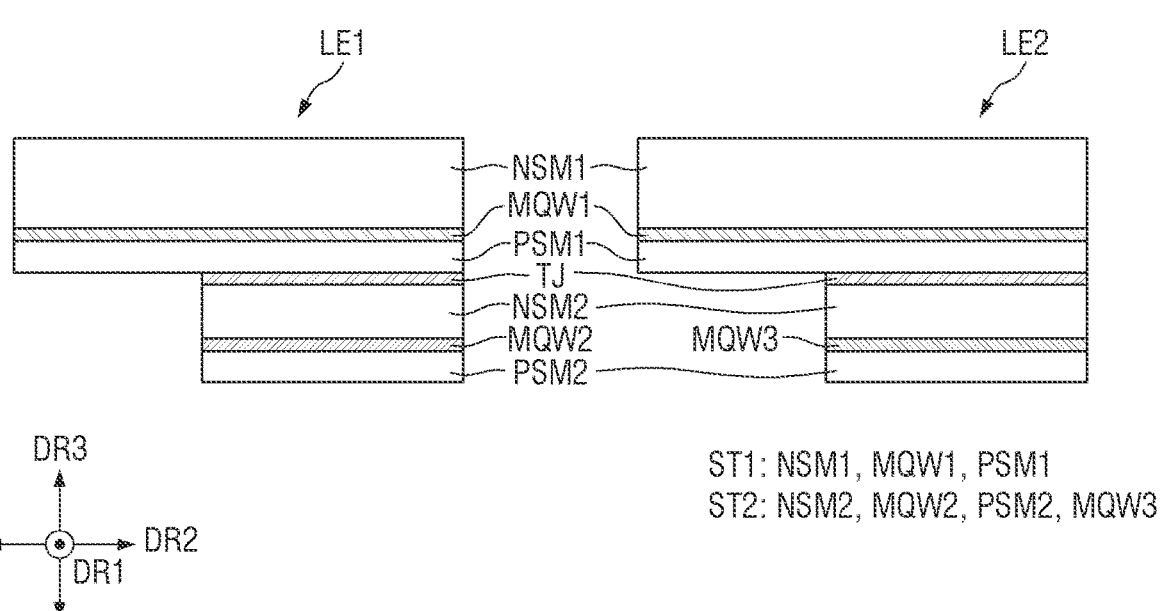
FIG. 5 is a cross-sectional view illustrating an example of a light emitting element of the display panel according to one or more embodiments.
Figure 6:
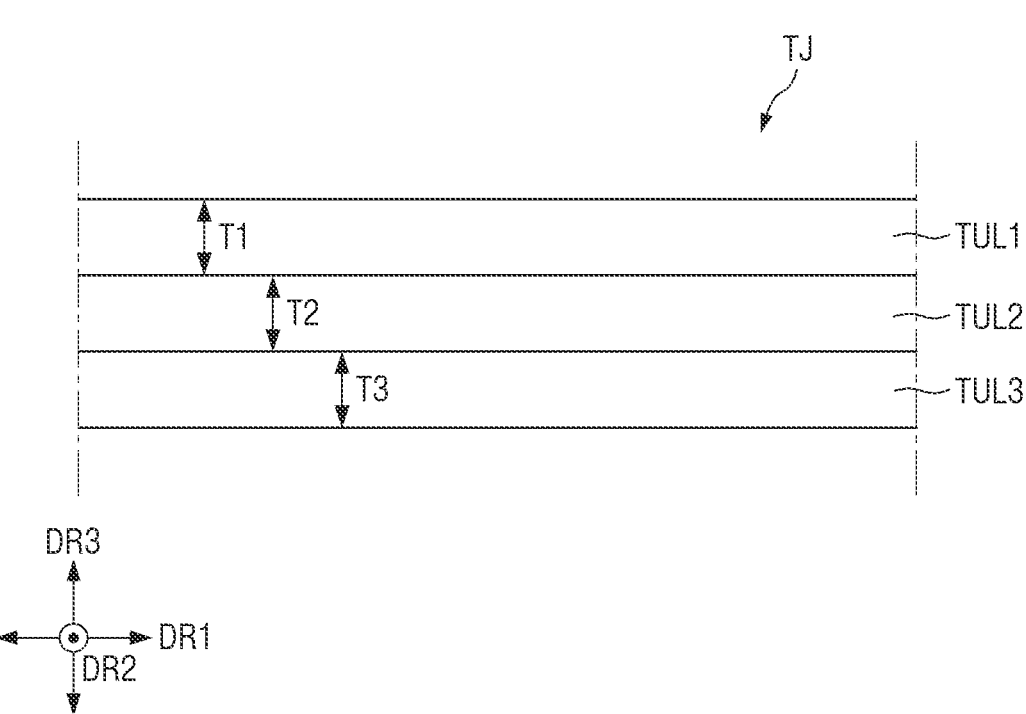
FIG. 6 is a cross-sectional view illustrating a tunnel functional layer of the light emitting element according to one or more embodiments.
Figure 7:
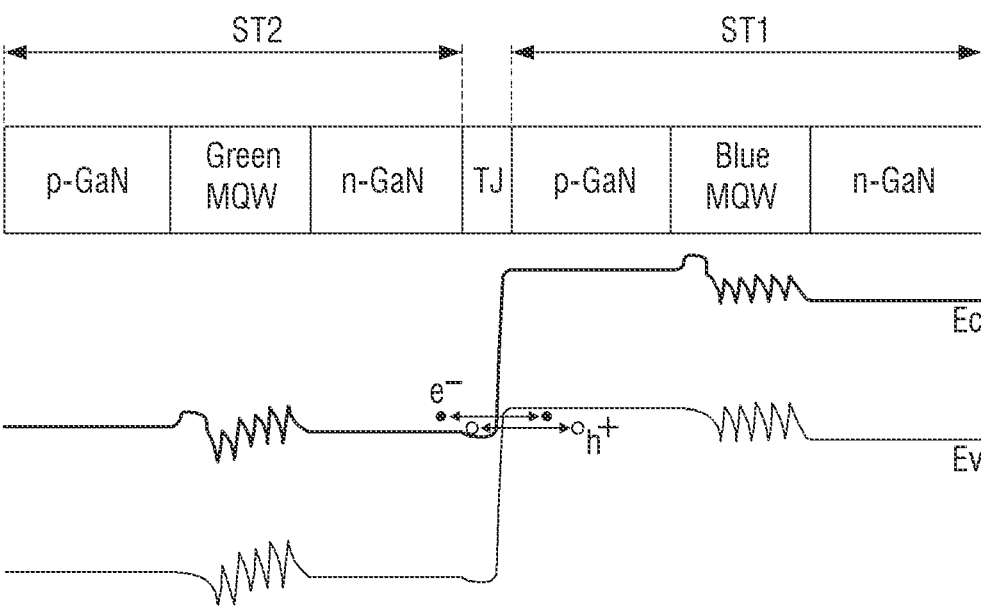
FIG. 7 is a schematic view illustrating movement of electrons and holes in the tunnel functional layer of the light emitting element.

FIG. 4 is a cross-sectional view illustrating an example of a display panel taken along line Q1-Q1' of FIG. 2. FIG. 5 is a cross-sectional view illustrating an example of a light emitting element of the display panel according to one or more embodiments. FIG. 6 is a cross-sectional view illustrating a tunnel functional layer of the light emitting element according to one or more embodiments. FIG. 7 is a schematic view illustrating the movement of electrons and holes in the tunnel functional layer of the light emitting element.

Referring to FIGS. 4 to 7, the display panel 10 according to one or more embodiments may include a semiconductor circuit substrate 100 and a light emitting element layer 120.

The semiconductor circuit substrate 100 may include a first substrate 110, pixel circuit parts PXC1 and PXC2, a common circuit part CAC, pixel electrodes ANO1 and ANO2, a common electrode CEP, contact electrodes CAE1 and CAE2, a first pad PD1, and a circuit insulating layer CINS.

The first substrate 110 may be a silicon wafer substrate formed using a suitable semiconductor process. The first substrate 110 may be made of single crystal silicon.

A plurality of pixel circuit parts PXC1 and PXC2 may be arranged in the display area DA. Each of the plurality of pixel circuit parts PXC1 and PXC2 may be connected to each of the pixel electrodes ANO1 and ANO2 corresponding thereto. For example, the plurality of pixel circuit parts PXC1 and PXC2 may include first pixel circuit parts PXC1 and second pixel circuit parts PXC2. The first pixel circuit part PXC1 may be connected to a first stack ST1 including a first active layer MQW1, and the second pixel circuit part PXC2 may be connected to a second stack ST2 including a second active layer MQW2 or a third active layer MQW3. For example, the second pixel circuit part PXC2 corresponding to the first light emitting element LE1 may be connected to the second stack ST2 including the second active layer MQW2 of the first light emitting element LE1, and the second pixel circuit part PXC2 corresponding to the second light emitting element LE2 may be connected to the second stack ST2 including the third active layer MQW3 of the second light emitting element LE2.

The respective pixel circuit parts PXC1 and PXC2 may be connected to the respective pixel electrodes ANO1 and ANO2 so as to correspond to the respective pixel electrodes ANO1 and ANO2 in a one-to-one manner. The pixel circuit parts PXC1 and PXC2 may form one group, and each group may overlap each of the first light emitting element LE1 and the second light emitting element LE2 in the third direction DR3.

The common circuit part CAC may be in the non-display area NDA. The common circuit part CAC may be connected to a first n-type semiconductor layer NSM1 commonly connected to a plurality of light emitting elements LE1 and LE2.

Each of the plurality of pixel circuit parts PXC1 and PXC2 and the common circuit part CAC may include at least one transistor formed by a suitable semiconductor process. In one or more embodiments, each of the plurality of pixel circuit parts PXC1 and PXC2 and the common circuit part CAC may further include at least one capacitor formed by the suitable semiconductor process. Each of the plurality of pixel circuit parts PXC1 and PXC2 and the common circuit part CAC may include, for example, a complementary metal-oxide semiconductor (CMOS) circuit. The CMOS circuit is a transistor that maximizes (or improves) a synergy effect of an n-channel metal oxide semiconductor field effect transistor (nMOSFET) and a p-channel metal oxide semiconductor field effect transistor (pMOSFET) by combining the nMOSFET and the pMOSFET with each other, that has low power consumption and is advantageous in improving a degree of integration. Each of the plurality of pixel circuit parts PXC1 and PXC2 may apply a pixel voltage or an anode voltage to each of the pixel electrodes ANO1 and ANO2, and the common circuit part CAC may apply a common voltage or a cathode voltage to each of the light emitting elements LE1 and LE2.

The circuit insulating layer CINS may be provided on the plurality of pixel circuit parts PXC1 and PXC2 and the common circuit part CAC. The circuit insulating layer CINS may protect the plurality of pixel circuit parts PXC1 and PXC2 and the common circuit part CAC, and may planarize a step of the plurality of pixel circuit parts PXC1 and PXC2 and the common circuit part CAC. The circuit insulating layer CINS may expose each of the pixel electrodes ANO1 and ANO2 and the common electrode CEP, so that the pixel electrodes ANO1 and ANO2 and the common electrode CEP may be connected (e.g., electrically coupled) to the light emitting element layer 120. The circuit insulating layer CINS may include an inorganic insulating material such as silicon oxide ($SiO_x$), silicon nitride ($SiN_x$), silicon oxynitride ($SiO_xN_y$), aluminum oxide ($Al_xO_y$), and/or aluminum nitride (AlN).

A plurality of pixel electrodes ANO1 and ANO2 may be provided on the pixel circuit parts PXC1 and PXC2 corresponding thereto, respectively. For example, the plurality of pixel electrodes ANO1 and ANO2 may include first pixel electrodes ANO1 and second pixel electrodes ANO2. The first pixel electrode ANO1 may be provided on the first pixel circuit part PXC1, and the second pixel electrode ANO2 may be provided on the second pixel circuit part PXC2. Each of the pixel electrodes ANO1 and ANO2 may be an exposed electrode exposed from the corresponding one of the pixel circuit parts PXC1 and PXC2 (e.g., from an interface between the pixel electrodes ANO1 and ANO2 and the respective pixel circuit parts PXC1 and PXC2). Each of the pixel electrodes ANO1 and ANO2 may be formed integrally with the corresponding one of the pixel circuit parts PXC1 and PXC2. Each of the pixel electrodes ANO1 and ANO2 may receive the pixel voltage or the anode voltage from the corresponding one of the pixel circuit parts PXC1 and PXC2. The pixel electrodes ANO1 and ANO2 may include a metal material such as aluminum (Al).

The common electrode CEP may be provided on the common circuit part CAC corresponding thereto. The common electrode CEP may be an exposed electrode exposed from the common circuit part CAC (e.g., from an interface between the common circuit part CAC and the common electrode CEP). The common electrode CEP may be formed integrally with the common circuit part CAC. The common electrode CEP may receive the common voltage or the cathode voltage from the common circuit part CAC. The common electrode CEP may include a metal material such as aluminum (Al).

The contact electrodes CAE1 and CAE2 may be provided on the pixel electrodes ANO1 and ANO2 corresponding thereto, respectively, and a common contact electrode CCA may be provided on the common electrode CEP. For example, the contact electrodes CAE1 and CAE2 may include first contact electrodes CAE1 and second contact electrodes CAE2. The first contact electrode CAE1 may be on the first pixel electrode ANO1, and the second contact electrode CAE2 may be on the second pixel electrode ANO2. In addition, the common contact electrode CCA may be on the common electrode CEP.

The contact electrodes CAE1 and CAE2 may include a metal material for bonding the pixel electrodes ANO1 and ANO2 and the light emitting elements LE to each other, and the common contact electrode CCA may include a metal material for bonding the common electrode CEP and a common connection electrode CCN to each other. For example, the contact electrodes CAE1 and CAE2 and the common contact electrode CCA may include at least one of gold (Au), copper (Cu), aluminum (Al), or tin (Sn). In one or more embodiments, the contact electrodes CAE1 and CAE2 and the common contact electrode CCA may include a first layer including any one of gold (Au), copper (Cu), aluminum (Al), or tin (Sn) and a second layer including another of gold (Au), copper (Cu), aluminum (Al), or tin (Sn).

The common contact electrode CCA may be on the common electrode CEP of the non-display area NDA, and may surround the display area DA. The common contact electrode CCA may be connected (e.g., electrically coupled) to any one of the first pads PD1 of the first pad part PDA1 through the common circuit part CAC formed in the non-display area NDA to receive a common voltage. The common contact electrode CCA may electrically connect a power line of the common circuit part CAC and the common connection electrode CCN of the light emitting element layer 120 to each other.

A plurality of first pads PD1 may be provided in the first pad area PDA1 in the non-display area NDA. The plurality of first pads PD1 may be spaced apart from the common contact electrode CCA. The plurality of first pads PD1 may be spaced apart from the common contact electrode CCA toward the outside of the non-display area NDA.

Pad connection electrodes PDC may be provided on the first pads PD1. The pad connection electrodes PDC may be in contact with upper surfaces of the first pads PD1. The pad connection electrodes PDC may be connected to circuit pads CPD of a circuit board CB through conductive connection members such as wires WR. For example, the first pads PD1, the pad connection electrodes PDC, the wires WR, and the circuit pads CPD of the circuit board CB may be electrically connected to each other.

In one or more embodiments, the semiconductor circuit substrate 100 and the circuit board CB may be provided on a lower substrate. The semiconductor circuit substrate 100 and the circuit board CB may be attached to an upper surface of the lower substrate using an adhesive member such as a pressure sensitive adhesive.

The circuit board CB may be a flexible film such as a flexible printed circuit board (FPCB), a printed circuit board (PCB), a flexible printed circuit (FPC), and/or a chip on film (COF).

The light emitting element layer 120 may include a second substrate 210, first and second light emitting elements LE1 and LE2, connection electrodes CNE1 and CNE2, and the common connection electrode CCN.

The second substrate 210 may face the first substrate 110 of the semiconductor circuit substrate 100. The second substrate 210 may support each of the light emitting elements LE1 and LE2. The second substrate 210 may include a sapphire ($Al_2O_3$) substrate and/or a transparent substrate such as a silicon (Si) substrate, and/or a glass substrate. However, the present disclosure is not limited thereto, and the second substrate 210 may also be formed as a conductive substrate made of GaN, SiC, ZnO, Si, GaP, GaAs, and/or the like. Hereinafter, a case where the second substrate 210 is the sapphire ($Al_2O_3$) substrate will be described by way of example. A thickness of the second substrate 210 is not particularly limited, and the second substrate 210 may have a thickness in the range of about 400 μm to about 1500 μm as an example.

Each of the light emitting elements LE1 and LE2 may be provided on one surface of the second substrate 210. Each of the light emitting elements LE1 and LE2 may be on a lower surface of the second substrate 210 facing the first substrate 110. The first light emitting element LE1 may include the first stack ST1 including the first active layer MQW1 emitting (e.g., configured to emit) the first light and the second stack ST2 including the second active layer MQW2 emitting (e.g., configured to emit) the second light. The second light emitting element LE2 may include the first stack ST1 including the first active layer MQW1 emitting (e.g., configured to emit) the first light and the second stack ST2 including the third active layer MQW3 emitting (e.g., configured to emit) the third light.

The first light emitting element LE1 may include a first emission area EA1 from which the first light is emitted (e.g., is configured to be emitted) and a second emission area EA2 from which the second light is emitted (e.g., is configured to be emitted), and the second light emitting element LE2 may include a first emission area EA1 from which the first light is emitted (e.g., is configured to be emitted) and a second emission area EA2 from which the third light is emitted (e.g., is configured to be emitted). In each of the light emitting elements LE1 and LE2, the first emission area EA1 may be partitioned by an area of the first stack ST1 in a plan view, and the second emission area EA2 may be partitioned by an area of the second stack ST2 in a plan view. Here, the area of the first emission area EA1 may be greater than that of the second emission area EA2.

Each of the light emitting elements LE1 and LE2 may be a vertical light emitting diode element extending to be elongated in the third direction DR3. In one or more embodiments, a length of each of the light emitting elements LE1 and LE2 in the third direction DR3 may be smaller than a length of each of the light emitting elements LE1 and LE2 in a horizontal direction. The length in the horizontal direction refers to a length in the first direction DR1 or a length in the second direction DR2. For example, the length of each of the light emitting elements LE1 and LE2 in the third direction DR3 may be approximately 1 to 5 μm. However, the present disclosure is not limited thereto, and the length of each of the light emitting elements LE1 and LE2 in the third direction DR3 may also be greater than the length of each of the light emitting elements LE1 and LE2 in the horizontal direction.

As illustrated in FIGS. 4 and 5, each of the light emitting elements LE1 and LE2 may have a shape in which plates having different areas are stacked. However, the present disclosure is not limited thereto, and each of the light emitting elements LE1 and LE2 may have a shape such as a cylindrical shape, a disk shape, and/or a rod shape, a shape such as a wire shape and/or a tube shape, and/or a polygonal prismatic shape such as a cubic shape, a rectangular parallelepiped shape, and/or a hexagonal prismatic shape, or may have various suitable shapes such as a shape extending in one direction and having outer surfaces partially inclined.

Each of the light emitting elements LE1 and LE2 may be a micro light emitting diode element. Each of the light emitting elements LE1 and LE2 may include the first stack ST1 and the second stack ST2 on the second substrate 210 in the third direction toward the first substrate 110.

Referring to FIG. 5, the first stack ST1 may include the first active layer MQW1 emitting the first light. For example, the first stack ST1 may include a first n-type semiconductor layer NSM1, a first p-type semiconductor layer PSM1, and the first active layer MQW1 interposed between the first n-type semiconductor layer NSM1 and the first p-type semiconductor layer PSM1.

The first n-type semiconductor layer NSM1 may be on one surface of the second substrate 210, and may be an n-type semiconductor. The first n-type semiconductor layer NSM1 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first n-type semiconductor layer NSM1 may be doped with an n-type dopant, which may be Si, Ge, Se, Sn, and/or the like. For example, the first n-type semiconductor layer NSM1 may be made of n-GaN doped with n-type Si. A thickness of the first n-type semiconductor layer NSM1 may be in the range of about 2 μm to about 4 μm, but is not limited thereto.

The first n-type semiconductor layer NSM1 may continuously extend in each of the light emitting elements LE1 and LE2. For example, the first n-type semiconductor layer NSM1 may be a common layer in each of the light emitting elements LE1 and LE2 and may serve as a common electrode.

The first active layer MQW1 may be provided on one surface of the first n-type semiconductor layer NSM1. The first active layer MQW1 may be on a lower surface of the first n-type semiconductor layer NSM1 facing the first substrate 110. The first active layer MQW1 may emit light by a combination of electron-hole pairs according to electrical signals applied through the first n-type semiconductor layer NSM1 and the first p-type semiconductor layer PSM1. The first active layer MQW1 may emit first light having a central wavelength band in the range of 450 nm to 495 nm, for example, light of a blue wavelength band.

The first active layer MQW1 may include a material having a single or multiple quantum well structure. When the first active layer MQW1 includes the material having the multiple quantum well structure, the first active layer MQW1 may have a structure in which a plurality of well layers and barrier layers are alternately stacked. In this case, the well layer may be made of InGaN, and the barrier layer may be made of GaN and/or AlGaN, but the present disclosure is not limited thereto. A thickness of the well layer may be approximately 1 to 4 nm, and a thickness of the barrier layer may be approximately 3 nm to 10 nm.

In one or more embodiments, the first active layer MQW1 may have a structure in which semiconductor materials having large band gap energy and semiconductor materials having small band gap energy are alternately stacked, and may include other Group III to Group V semiconductor materials depending on a wavelength band of light to be emitted. The light to be emitted by the first active layer MQW1 is not limited to the first light, and in some cases, the first active layer MQW1 may emit second light (light of a green wavelength band) or third light (light of a red wavelength band).

The first p-type semiconductor layer PSM1 may be provided on one surface of the first active layer MQW1. The first p-type semiconductor layer PSM1 may be on a lower surface of the first active layer MQW1 facing the first substrate 110. The first p-type semiconductor layer PSM1 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The first p-type semiconductor layer PSM1 may be doped with a p-type dopant, which may be Mg, Zn, Ca, Sr, Ba, and/or the like. For example, the first p-type semiconductor layer PSM1 may be made of p-GaN doped with p-type Mg. A thickness of the first p-type semiconductor layer PSM1 may be in the range of about 30 nm to about 200 nm, but is not limited thereto.

The second stack ST2 of the first light emitting element LE1 may include the second active layer MQW2 emitting the second light, and the second stack ST2 of the second light emitting element LE2 may include the third active layer MQW3 emitting the third light.

For example, the second stack ST2 of each of the light emitting elements LE1 and LE2 may include a second n-type semiconductor layer NSM2 and a second p-type semiconductor layer PSM2.

The second n-type semiconductor layer NSM2 may be below the first stack ST1. The second n-type semiconductor layer NSM2 may be an n-type semiconductor layer supplying electrons to the second active layer MQW2 or the third active layer MQW3. The second n-type semiconductor layer NSM2 may include the same material as the first n-type semiconductor layer NSM1 described above, and may have the same thickness as the first n-type semiconductor layer NSM1 described above.

The second p-type semiconductor layer PSM2 may be on a lower surface of the second active layer MQW2 or the third active layer MQW3. The second p-type semiconductor layer PSM2 may be a p-type semiconductor layer supplying holes to the second active layer MQW2 or the third active layer MQW3. The second p-type semiconductor layer PSM2 may include the same material as the first p-type semiconductor layer PSM1 described above, and may have the same thickness as the first p-type semiconductor layer PSM1 described above.

In the first light emitting element LE1, the second active layer MQW2 may be on a lower surface of the second n-type semiconductor layer NSM2. The second active layer MQW2 may emit light by a combination of electron-hole pairs according to electrical signals applied through the second n-type semiconductor layer NSM2 and the second p-type semiconductor layer PSM2. The second active layer MQW2 may emit second light having a central wavelength band in the range of about 610 nm to about 650 nm, for example, light of a red wavelength band.

In the second light emitting element LE2, the third active layer MQW3 may be on a lower surface of the second n-type semiconductor layer NSM2. The third active layer MQW3 may emit light by a combination of electron-hole pairs according to electrical signals applied through the second n-type semiconductor layer NSM2 and the second p-type semiconductor layer PSM2. The third active layer MQW3 may emit third light having a central wavelength band in the range of about 510 nm to about 550 nm, for example, light of a green wavelength band.

The second active layer MQW2 and the third active layer MQW3 may include the same material as the first active layer MQW1 described above. However, the second active layer MQW2 and the third active layer MQW3 may have component ratios different from that of the first active layer MQW1 in order to emit the second light and the third light. For example, when each of the first active layer MQW1, the second active layer MQW2, and the third active layer MQW3 includes InGaN, a color of light emitted by each of the first active layer MQW1, the second active layer MQW2, and the third active layer MQW3 may be changed depending on a content of indium (In). For example, as the content of indium (In) increases, a wavelength band of the light emitted by the active layers may move to a red wavelength band, and as the content of indium (In) decreases, a wavelength band of the light emitted by the active layers may move to a blue wavelength band.

Therefore, a content of indium (In) in the first active layer MQW1 may be lower than a content of indium (In) in each of the second active layer MQW2 and the third active layer MQW3. In the present embodiments, the second active layer MQW2 and the third active layer MQW3 may have the same content of indium (In). For example, the content of indium (In) in the first active layer MQW1 may be 15%, the content of indium (In) in each of the second active layer MQW2 and the third active layer MQW3 may be 30% or higher, for example, 30% to 45%. For example, the first active layer MQW1 may emit light of a color different from that of the second active layer MQW2 and the third active layer MQW3 by adjusting the contents of indium (In) in the active layers. The second active layer MQW2 and the third active layer MQW3 may have the same content of indium (In), but may emit light of different colors by making current densities applied to the second active layer MQW2 and the third active layer MQW3 different from each other. A more detailed description thereof will be provided herein below.

The respective light emitting elements LE1 and LE2 according to one or more embodiments may have a structure in which two stacks ST1 and ST2, each including two different active layers MQW1 and MQW2 or MQW3, are vertically stacked. For example, the first stack ST1 including the first active layer MQW1 and the second stack ST2 including the second active layer MQW2 may be stacked in the first light emitting element LE1, and the first stack ST1 including the first active layer MQW1 and the second stack ST2 including the third active layer MQW3 may be stacked in the second light emitting element LE2. At a place where the p-type semiconductor layer and the n-type semiconductor layer of the respective stacks ST1 and ST2 are in contact with each other, electrons and holes may not move, and thus, the light emitting elements LE1 and LE2 may not emit light.

In the present embodiments, by providing a tunnel functional layer TJ between the respective stacks ST1 and ST2 of the respective light emitting elements LE1 and LE2, electrons and holes may be moved to adjacent stacks ST1 and ST2 in (e.g., through) the tunnel functional layer TJ.

Referring to FIGS. 6 and 7, the tunnel functional layer TJ may be between the first stack ST1 and the second stack ST2. The tunnel functional layer TJ may include a first tunnel layer TUL1, a second tunnel layer TUL2, and a third tunnel layer TUL3.

The first tunnel layer TUL1 may be an n-type semiconductor. The first tunnel layer TUL1 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first tunnel layer TUL1 may be doped with an n-type dopant, which may be Te, Si, Ge, Se, Sn, C, and/or the like.

For example, the first tunnel layer TUL1 may be made of n-GaN doped with n-type Si. The n-type dopant doped in the first tunnel layer TUL1 may be doped at a concentration of $2 \times 10^{20}/cm^3$ to $2 \times 10^{21}/cm^3$, but is not limited thereto. A thickness T1 of the first tunnel layer TUL1 may be in the range of about 1 nm to about 50 nm, but is not limited thereto.

The second tunnel layer TUL2 may be an n-type semiconductor. The second tunnel layer TUL2 may include a semiconductor material having a chemical formula of $Al_x$-$Ga_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The second tunnel layer TUL2 may be doped with an n-type dopant, which may be Te, Si, Ge, Se, Sn, C, and/or the like. For example, the second tunnel layer TUL2 may be made of n-InGaN doped with n-type Si. The n-type dopant doped in the second tunnel layer TUL2 may be doped at a concentration of $2 \times 10^{20}/cm^3$ to $2 \times 10^{21}/cm^3$, but is not limited thereto. A thickness T2 of the second tunnel layer TUL2 may be in the range of about 1 nm to about 5 nm, but is not limited thereto. In one or more embodiments, the thickness T2 of the second tunnel layer TUL2 may be smaller than that of the first tunnel layer TUL1 and the third tunnel layer TUL3.

The third tunnel layer TUL3 may be a p-type semiconductor layer. The third tunnel layer TUL3 may include a semiconductor material having a chemical formula of $Al_x$-$Ga_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The third tunnel layer TUL3 may be doped with a p-type dopant, which may be Mg, Zn, Ca, Ba, Be, and/or the like. For example, the third tunnel layer TUL3 may be made of p-GaN doped with p-type Mg. The p-type dopant doped in the third tunnel layer TUL3 may be doped at a concentration of $5 \times 10^{18}/cm^3$ to $5 \times 10^{19}/cm^3$, but is not limited thereto. A thickness T3 of the third tunnel layer TUL3 may be in the range of about 3 nm to about 50 nm, but is not limited thereto.

In one or more embodiments, the concentration of the p-type dopant doped in the third tunnel layer TUL3 may be lower than the concentration of the n-type dopant doped in the first tunnel layer TUL1 and the concentration of the n-type dopant doped in the second tunnel layer TUL2. In some embodiments, the concentration of the n-type dopant doped in the first tunnel layer TUL1 and the concentration of the n-type dopant doped in the second tunnel layer TUL2 may be the same as each other.

The first tunnel layer TUL1 may in contact with the p-type semiconductor layer PSM1, and the third tunnel layer TUL3 may be in contact with the n-type semiconductor layers NSM2 and NSM3. The second tunnel layer TUL2 may be between the first tunnel layer TUL1 and the third tunnel layer TUL3 so as to be in contact with each of the first tunnel layer TUL1 and the third tunnel layer TUL3. For example, the first tunnel layer TUL1, the second tunnel layer TUL2, and the third tunnel layer TUL3 may be sequentially stacked so that adjacent layers are in contact with each other. For example, the first tunnel layer TUL1 of the tunnel functional layer TJ may be in contact with the first p-type semiconductor layer PSM1 of the first stack ST1, and the third tunnel layer TUL3 of the tunnel functional layer TJ may be in contact with the second n-type semiconductor layer NSM2 of the second stack ST2.

The tunnel functional layer TJ described above may move electrons and holes to the adjacent stacks ST1 and ST2.

FIG. 7 is a schematic view illustrating an energy band of the second light emitting element LE2. When a positive voltage is applied to a p-type semiconductor and a negative voltage is applied to an n-type semiconductor at a general pn junction (forward voltage), electrons move from a conduction band (Ec) of the n-type semiconductor to the p-type semiconductor, and holes move from a valence band (Ev) of the p-type semiconductor to the n-type semiconductor, and the electrons and the holes meet at a pn junction interface, such that recombination of the electrons and the holes is generated.

On the other hand, when a negative voltage is applied to the p-type semiconductor and a positive voltage is applied to the n-type semiconductor (reverse voltage), a valence band of the p-type semiconductor has energy higher than that of a conduction band of the n-type semiconductor, such that electrons inside the valence band of the p-type semiconductor may move to the conduction band of the n-type semiconductor. Such a phenomenon may occur under several conditions. Among them, a first condition is that a doping concentration of the semiconductor is relatively high and a second condition is that a thickness of the semiconductor is relatively small.

In the present embodiments, the tunnel functional layer TJ includes the first tunnel layer TUL1, which is the n-type semiconductor layer, the second tunnel layer TUL2, which is the n-type semiconductor layer, and the third tunnel layer TUL3, which is the p-type semiconductor layer. In one or more embodiments, the concentrations of the dopants doped in the first tunnel layer TUL1 and the second tunnel layer TUL2, and the concentration of the dopant doped in the third tunnel layer TUL3, are in the ranges of about $2 \times 10^{20}/cm^3$ to about $2 \times 10^{21}/cm^3$ and about $5 \times 10^{18}/cm^3$ to about $5 \times 10^{19}/cm^3$, respectively, which are very (e.g., relatively) high. In addition, the thicknesses T1, T2, and T3 of the first tunnel layer TUL1, the second tunnel layer TUL2, and the third tunnel layer TUL3 are several tens of nanometers or less, which are very (e.g., relatively) small.

As a result, the tunnel functional layer TJ according to the present embodiments may enable the movement of the electrons and the holes between the first p-type semiconductor layer PSM1 of the first stack ST1 and the second n-type semiconductor layer NSM2 of the second stack ST2 by satisfying the conditions described above.

Accordingly, light may be emitted by generating recombination of the electrons and the holes in the active layers MQW1, MQW2, and MQW3 of each of the first and second stacks ST1 and ST2 within each of the light emitting elements LE1 and LE2 in which the first stack ST1 and the second stack ST2 are stacked.

In one or more embodiments, each of the light emitting elements LE1 and LE2 may further include an electron blocking layer. The electron blocking layer may be between the active layer and the p-type semiconductor layer in each of the stacks ST1 and ST2. The electron blocking layer may be a layer for suppressing, preventing, or reducing the flow of too many electrons into the active layer. For example, the electron blocking layer may be made of p-AlGaN doped with p-type Mg. A thickness of the electron blocking layer may be in the range of about 10 nm to about 50 nm, but is not limited thereto. In some embodiments, the electron blocking layer may not be provided.

Referring back to FIG. 4, the light emitting element layer 120 may include a plurality of connection electrodes CNE1 and CNE2. The light emitting element layer 120 may include first connection electrodes CNE1 and second connection electrodes CNE2. The first connection electrode CNE1 may connect the first stack ST1 of each of the light emitting elements LE1 and LE2 to corresponding first contact electrodes CAE1. The first connection electrode CNE1 may overlap the first stack ST1 and the first contact electrode CAE1, and may be in contact with each of the first stack ST1 and the first contact electrode CAE1. The first connection electrode CNE1 may be in contact with the first p-type semiconductor layer PSM1 of the first stack ST1. The first connection electrode CNE1 may supply the anode voltage so that the first active layer MQW1 of the first stack ST1 may emit light.

The second connection electrode CNE2 may connect the second stack ST2 of each of the light emitting elements LE1 and LE2 to corresponding second contact electrodes CAE2. The second connection electrode CNE2 may overlap the second stack ST2 and the second contact electrode CAE2, and may be in contact with each of the second stack ST2 and the second contact electrode CAE2. The second connection electrode CNE2 may be in contact with the second p-type semiconductor layer PSM2 of the second stack ST2. The second connection electrode CNE2 may supply the anode voltage so that the second active layer MQW2 or the third active layer MQW3 of the second stack ST2 may emit light.

Each of the connection electrodes CNE1 and CNE2 may be an ohmic connection electrode. However, the present disclosure is not limited thereto, and each of the connection electrodes CNE1 and CNE2 may also (or alternatively) be a Schottky connection electrode. The connection electrodes CNE1 and CNE2 (e.g., each of the connection electrodes CNE1 and CNE2) may decrease resistance between the light emitting elements LE1 and LE2 (e.g., each of the light emitting elements LE1 and LE2) and the contact electrode when each of the light emitting elements LE1 and LE2 is electrically connected to the contact electrode in the display device 1 according to one or more embodiments. Each of the connection electrodes CNE1 and CNE2 may include a conductive metal. For example, each of the connection electrodes CNE1 and CNE2 may include at least one of gold (Au), copper (Cu), tin (Sn), titanium (Ti), aluminum (Al), or silver (Ag). For example, each of the connection electrodes CNE1 and CNE2 may include an alloy of gold and tin in a ratio is 9:1, 8:2, or 7:3, or include an alloy (SAC305) of copper, silver, and tin.

A distance D1 between the first stack ST1 of each of the light emitting elements LE1 and LE2 and the semiconductor circuit substrate 100 may be greater than a distance D2 between the second stack ST2 of each of the light emitting elements LE1 and LE2 and the semiconductor circuit substrate 100. Here, the distances between the respective stacks ST1 and ST2 and the semiconductor circuit substrate 100 refer to distances between the p-type semiconductor layers PSM1 and PSM2 of the respective stacks ST1 and ST2 and the contact electrodes CAE1 and CAE2 of the semiconductor circuit substrate 100. In addition, the distance D2 between the second stack ST2 and the semiconductor circuit substrate 100 may be smaller than the distance D1 between the first stack ST1 and the semiconductor circuit substrate 100.

Accordingly, thicknesses of the connection electrodes CNE1 and CNE2, that is equal to the distances between the respective stacks ST1 and ST2 and the semiconductor circuit substrate 100, may also have a magnitude relationship therebetween. For example, the thickness of the first connection electrode CNE1 may be greater than that of the second connection electrode CNE2.

In one or more embodiments, the common connection electrode CCN may be provided in the common electrode connection part CPA of the non-display area NDA. The common connection electrode CCN may be on one surface(s) of the first n-type semiconductor layer(s) NSM1 of the first stacks ST1 of the light emitting elements LE1 and LE2 extending from the display area DA to the non-display area NDA. The common connection electrode CCN may serve to transfer the common voltage of the light emitting elements LE from the common contact electrode CCA. The common connection electrode CCN may be made of the same material as the connection electrodes CNE1 and CNE2. The common connection electrode CCN may have a great (e.g., relatively large) thickness in the third direction DR3 in order to be connected to the common contact electrode CCA. The thickness of the common connection electrode CCN may be greater than the thicknesses of the connection electrodes CNE1 and CNE2.

The light emitting elements LE1 and LE2 described above may allow the respective active layers MQW1, MQW2 and MQW3 included in the respective stacks ST1 and ST2 to individually emit light. For example, the first active layer MQW1 of the first stack ST1 of the first light emitting element LE1 may emit the light by supplying the cathode voltage to the first n-type semiconductor layer NSM1 of the first stack ST1 through the common connection electrode CCN, and supplying the anode voltage to the first p-type semiconductor layer PSM1 through the first connection electrode CNE1. The second active layer MQW2 of the second stack ST2 of the first light emitting element LE1 may emit the light by supplying the cathode voltage to the second n-type semiconductor layer NSM2 of the second stack ST2 through the first connection electrode CNE1 and supplying the anode voltage to the second p-type semiconductor layer PSM2 through the second connection electrode CNE2. In this case, the cathode voltage supplied by the first connection electrode CNE1 may be supplied to the second n-type semiconductor layer NSM2 through the tunnel functional layer TJ. Similarly, the third active layer MQW3 of the second stack ST2 of the second light emitting element LE2 may emit the light by supplying the cathode voltage to the second n-type semiconductor layer NSM2 of the second stack ST2 through the first connection electrode CNE1 and supplying the anode voltage to the second p-type semiconductor layer PSM2 through the second connection electrode CNE2.

As described above, each of the plurality of pixels PX of the display panel 10 may display various colors without a wavelength conversion layer by including the first light emitting element LE1 emitting (e.g., configured to emit) the first light and the second light and the second light emitting element LE2 emitting (e.g., configured to emit) the first light and the third light.

Figure 8:
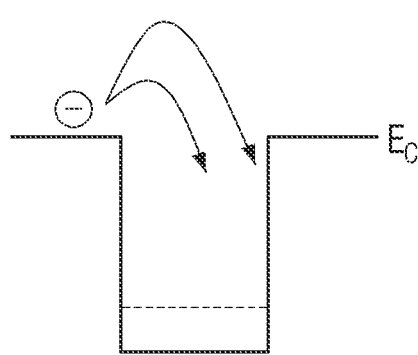
FIG. 8 is an illustrative view illustrating a band gap of a second active layer of a first light emitting element when a driving current having a first current density is applied.
Figure 8:
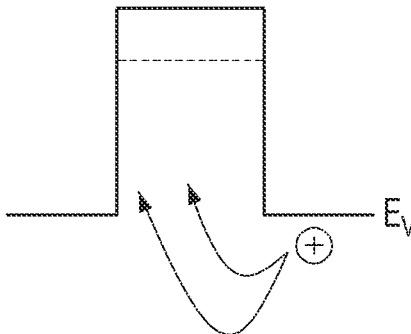
Figure 9:
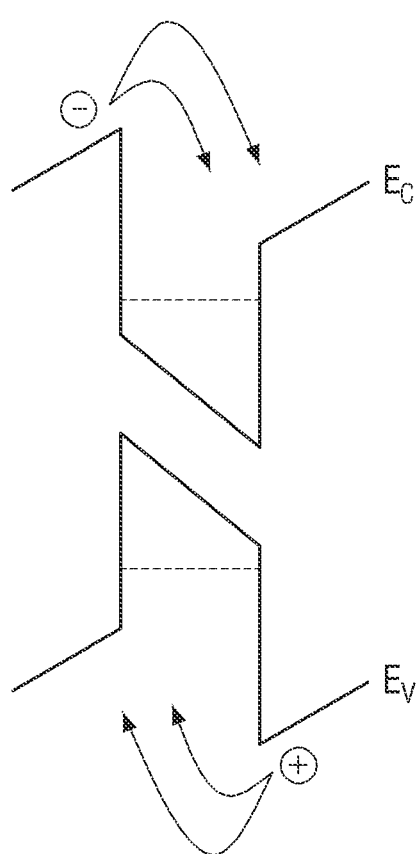
FIG. 9 is another illustrative view illustrating a band gap of a second active layer of a first light emitting element when a driving current having a second current density is applied.

FIG. 8 is an illustrative view illustrating a band gap of a second active layer of a first light emitting element when a driving current having a first current density is applied. FIG. 9 is another illustrative view illustrating a band gap of a second active layer of a first light emitting element when a driving current having a second current density is applied.

Referring to FIGS. 8 and 9, the second active layer MQW2 of the first light emitting element LE1 and the third active layer MQW3 of the second light emitting element LE2 are made of the same material. For example, the second active layer MQW2 of the first light emitting element LE1 and the third active layer MQW3 of the second light emitting element LE2 may be made of InGaN of which a content of indium (In) is 30% (for example, 30% to 45%) or more.

In this case, a color of the light emitted from the second active layer MQW2 of the first light emitting element LE1 and the third active layer MQW3 of the second light emitting element LE2 may be shifted from red to blue according to a current density. For example, band gaps of the second active layer MQW2 of the first light emitting element LE1 and the third active layer MQW3 of the second light emitting element LE2 may be changed from a rectangular shape as illustrated in FIG. 8 to a trapezoidal shape as illustrated in FIG. 9 due to a quantum-confined Stark effect (QCSE) as the current density increases. In this case, band filling in which carriers fill a quantum well of the second active layer MQW2 or the third active layer MQW3 is faster when the band gap has the trapezoidal shape as illustrated in FIG. 9, than when the band gap has the rectangular shape as illustrated in FIG. 8, and thus, electrons and holes may be recombined with each other in a higher state when the band gap has the trapezoidal shape as illustrated in FIG. 9. Therefore, as the current density applied to the second active layer MQW2 of the first light emitting element LE1 and the third active layer MQW3 of the second light emitting element LE2 increases, the second active layer MQW2 of the first light emitting element LE1 and the third active layer MQW3 of the second light emitting element LE2 may emit light of a short wavelength. As the current density applied to the second active layer MQW2 of the first light emitting element LE1 and the third active layer MQW3 of the second light emitting element LE2 decreases, the second active layer MQW2 of the first light emitting element LE1 and the third active layer MQW3 of the second light emitting element LE2 may emit light of a long wavelength.

As described above, even though the second active layer MQW2 of the first light emitting element LE1 and the third active layer MQW3 of the second light emitting element LE2 are made of the same material, for example, the second active layer MQW2 of the first light emitting element LE1 and the third active layer MQW3 of the second light emitting element LE2 are made of InGaN of which the content of indium (In) is 35% or more, the second active layer MQW2 and the third active layer MQW3 may be controlled to emit the light of the long wavelength and the light of the short wavelength by adjusting the current density of the driving current applied to each of the second active layer MQW2 and the third active layer MQW3.

Figure 10:
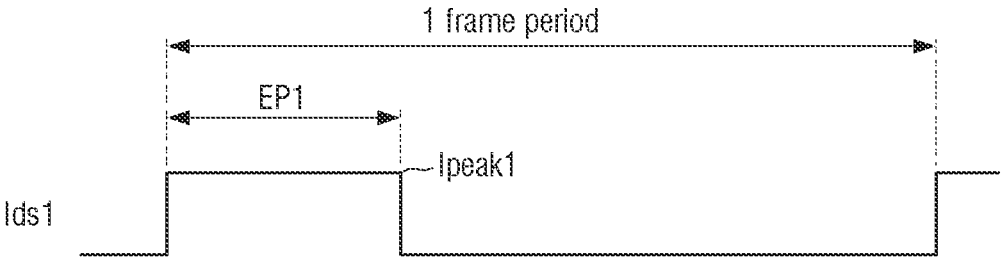
FIG. 10 is a waveform diagram illustrating a first driving current applied to a second stack of a first light emitting element according to one or more embodiments.
Figure 11:
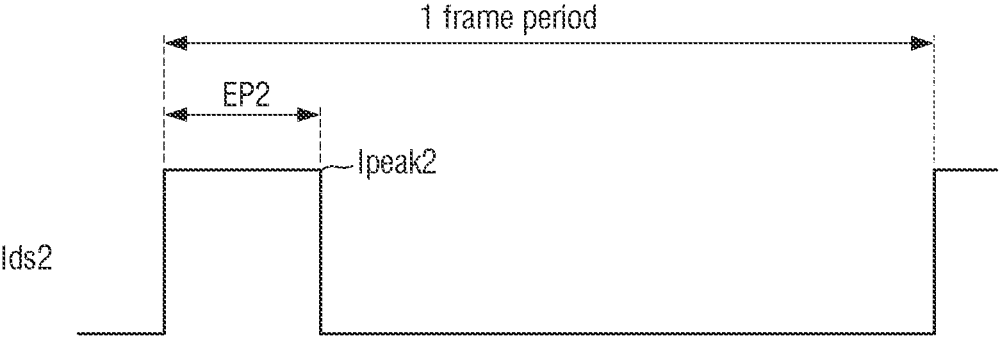
FIG. 11 is a waveform diagram illustrating a second driving current applied to a second stack of a second light emitting element according to one or more embodiments.

FIG. 10 is a waveform diagram illustrating a first driving current applied to a second stack of a first light emitting element according to one or more embodiments. FIG. 11 is a waveform diagram illustrating a second driving current applied to a second stack of a second light emitting element according to one or more embodiments.

In FIGS. 10 and 11, a first driving current Ids1 applied to the second stack ST2 of the first light emitting element LE1 and a second driving current Ids2 applied to the second stack ST2 of the second light emitting element LE2 during one frame period are illustrated. In FIGS. 10 and 11, the first driving current Ids1 (when the second stack ST2 of the first light emitting element LE1 expresses a peak white gradation) and the second driving current Ids2 (when the second stack ST2 of the second light emitting element LE2 expresses a peak white gradation) have been illustrated. The peak white gradation refers to the brightest brightness that may be expressed by the second stack ST2 of the first light emitting element LE1 and the second stack ST2 of the second light emitting element LE2.

Referring to FIGS. 10 and 11, the second active layer MQW2 of the first light emitting element LE1 and the third active layer MQW3 of the second light emitting element LE2 are made of the same material. In this case, in order for the second stack ST2 of the first light emitting element LE1 to emit the second light, and for the second stack ST2 of the second light emitting element LE2 to emit the third light, a current density of the second driving current Ids2 applied to the second stack ST2 of the light emitting element LE2 may be higher than a current density of the first driving current Ids1 applied to the second stack ST2 of the first light emitting element LE1. In addition, in order for the second stack ST2 of the first light emitting element LE1 to emit the second light of the same wavelength band regardless of a gradation, the current density of the first driving current Ids1 may be the same regardless of the gradation. In order for the second stack ST2 of the second light emitting element LE2 to emit the third light of the same wavelength band regardless of a gradation, the current density of the second driving current Ids2 may be the same regardless of the gradation.

Because the current density of the second driving current Ids2 is greater than the current density of the first driving current Ids1, a second peak current value Ipeak2 of the second driving current Ids2 may be higher than a first peak current value Ipeak1 of the first driving current Ids1.

A gradation of the second stack ST2 of the first light emitting element LE1 may be adjusted according to a period EP1 in which the first driving current Ids1 is applied to the second stack ST2 of the first light emitting element LE1. For example, the second stack ST2 of the first light emitting element LE1 may express a gradation close to a peak white gradation as the period EP1 in which the first driving current Ids1 is applied to the second stack ST2 of the first light emitting element LE1 becomes longer, and express a gradation close to a peak black gradation as the period EP1 in which the first driving current Ids1 is applied to the second stack ST2 of the first light emitting element LE1 becomes shorter.

A gradation of the second stack ST2 of the second light emitting element LE2 may be adjusted according to a period EP2 in which the second driving current Ids2 is applied to the second stack ST2 of the second light emitting element LE2. For example, the second stack ST2 of the second light emitting element LE2 may express a gradation close to a peak white gradation as the period EP2 in which the second driving current Ids2 is applied to the second stack ST2 of the second light emitting element LE2 becomes longer, and express a gradation close to a peak black gradation as the period EP2 in which the second driving current Ids2 is applied to the second stack ST2 of the second light emitting element LE2 becomes shorter.

Because the current density of the first driving current Ids1 is lower than the current density of the second driving current Ids2, the period EP1 in which the first driving current Ids1 is applied to the second stack ST2 of the first light emitting element LE1 expressing the peak white gradation may be longer than the period EP2 in which the second driving current Ids2 is applied to the second stack ST2 of the second light emitting element LE2 expressing the peak white gradation. For example, when the second stack ST2 of the first light emitting element LE1 and the second stack ST2 of the second light emitting element LE2 express the same gradation, the period EP1 in which the first driving current Ids1 is applied may be longer than the period EP2 in which the second driving current Ids2 is applied.

Because the first stacks ST1 of the respective light emitting elements LE1 and LE2 emit the first light equally (or substantially equally), driving currents applied to the first stacks ST1 of the respective light emitting elements LE1 and LE2 may be substantially the same as each other.

As described above, even though the second active layer MQW2 of the first light emitting element LE1 and the third active layer MQW3 of the second light emitting element LE2 are made of the same material, the second stack ST2 of the first light emitting element LE1 may emit the second light and the second stack ST2 of the second light emitting element LE2 may emit the third light by making the current density of the second driving current Ids2 applied to the second stack ST2 of the second light emitting element LE2 higher than the current density of the first driving current Ids1 applied to the second stack ST2 of the first light emitting element LE1.

In addition, in order for the second stack ST2 of the first light emitting element LE1 to emit the second light of the same wavelength band regardless of the gradation, the current density of the first driving current Ids1 may be controlled to be the same regardless of the gradation, and the gradation of the second stack ST2 of the first light emitting element LE1 may be adjusted according to the period EP1 in which the first driving current Ids1 is applied. In addition, in order for the second stack ST2 of the second light emitting element LE2 to emit the third light of the same wavelength band regardless of the gradation, the current density of the second driving current Ids2 may be controlled to be the same regardless of the gradation, and the gradation of the second stack ST2 of the second light emitting element LE2 may be adjusted according to the period EP2 in which the second driving current Ids2 is applied.

Figure 12:
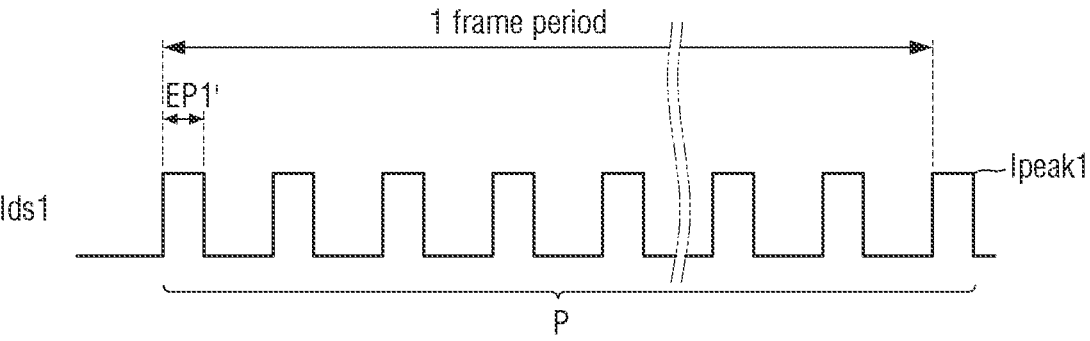
FIG. 12 is a waveform diagram illustrating a first driving current applied to a second stack of a first light emitting element according to one or more other embodiments.
Figure 13:
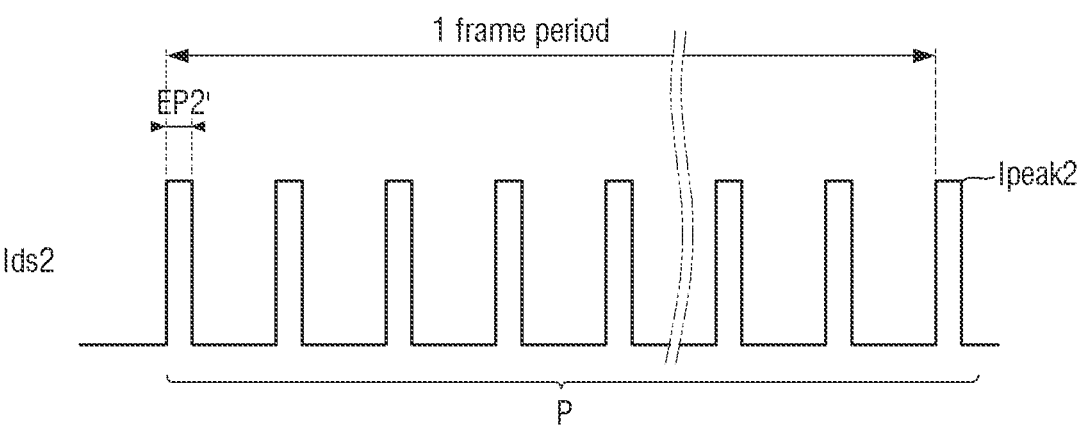
FIG. 13 is a waveform diagram illustrating a second driving current applied to a second stack of a second light emitting element according to one or more other embodiments.

FIG. 12 is a waveform diagram illustrating a first driving current applied to a second stack of a first light emitting element according to one or more other embodiments. FIG. 13 is a waveform diagram illustrating a second driving current applied to a second stack of a second light emitting element according to one or more other embodiments.

The embodiments of FIGS. 12 and 13 are different from one or more embodiments of FIGS. 10 and 11 in that the first driving current Ids1 is applied to the second stack ST2 of the first light emitting element LE1 plural (multiple) times and the second driving current Ids2 is applied to the second stack ST2 of the second light emitting element LE2 plural (multiple) times, during one frame period. In FIGS. 12 and 13, content that is different from that of one or more embodiments of FIGS. 10 and 11 will be mainly described.

Referring to FIGS. 12 and 13, the first driving current Ids1 may be applied to the second stack ST2 of the first light emitting element LE1 P times during one frame period. For example, one frame period may include P periods EP1' in which the first driving current Ids1 is applied. The P periods EP1' in which the first driving current Ids1 is applied may be the same as each other.

The second driving current Ids2 may be applied to the second stack ST2 of the second light emitting element LE2 P times during one frame period. For example, one frame period may include P periods EP2' in which the second driving current Ids2 is applied. The P periods EP2' in which the second driving current Ids2 is applied may be the same as each other.

A gradation of the second stack ST2 of the first light emitting element LE1 may be adjusted according to the period EP1' in which the first driving current Ids1 is applied. For example, the second stack ST2 of the first light emitting element LE1 may express a gradation close to a peak white gradation as the period EP1' in which the first driving current Ids1 is applied to the second stack ST2 of the first light emitting element LE1 becomes longer, and express a gradation close to a peak black gradation as the period EP1' in which the first driving current Ids1 is applied to the second stack ST2 of the first light emitting element LE1 becomes shorter.

A gradation of the second stack ST2 of the second light emitting element LE2 may be adjusted according to the period EP2' in which the second driving current Ids2 is applied. For example, the second stack ST2 of the second light emitting element LE2 may express a gradation close to a peak white gradation as the period EP2' in which the second driving current Ids2 is applied to the second stack ST2 of the second light emitting element LE2 becomes longer, and express a gradation close to a peak black gradation as the period EP2' in which the second driving current Ids2 is applied to the second stack ST2 of the second light emitting element LE2 becomes shorter.

Because the current density of the first driving current Ids1 is lower than the current density of the second driving current Ids2, when the second stack ST2 of the first light emitting element LE1 and the second stack ST2 of the second light emitting element LE2 express the same gradation, the period EP1' in which the first driving current Ids1 is applied may be longer than the period EP2' in which the second driving current Ids2 is applied. In addition, because the first driving current Ids1 is applied to the second stack ST2 of the first light emitting element LE1 P times and the second driving current Ids2 is applied to the second stack ST2 of the second light emitting element LE2 P times during one frame period, the sum of the periods EP1' in which the first driving current Ids1 is applied during one frame period may be longer than the sum of the periods EP2' in which the second driving current Ids2 is applied during one frame period.

As described above, in the display device 1 according to the embodiments, it is possible to allow the respective stacks ST1 and ST2 of the respective light emitting elements LE1 and LE2 to individually or simultaneously (or concurrently) emit the light by providing the tunnel functional layer TJ between a plurality of stacks ST1 and ST2 of the respective light emitting elements LE1 and LE2 to enable the movement of the electrons and the holes between the stacks ST1 and ST2. Accordingly, two light emitting elements LE1 and LE2 emit the blue light, the green light, and the red light, such that the number of sub-pixels may be decreased and one pixel PX may be constituted by the decreased number of sub-pixels. Therefore, a structure of the display device 1 and processes of manufacturing the display device 1 may be simplified, and the display device 1 having a high resolution may be implemented.

In one or more embodiments, it is possible to allow the plurality of stacks ST1 and ST2 to individually or simultaneously (or concurrently) emit the light by respectively providing the connection electrodes CNE1 and CNE2 on the plurality of stacks ST1 and ST2 of the respective light emitting elements LE1 and LE2. In addition, it may be possible to implement a full color by adjusting the periods in which the currents are applied to the respective stacks ST1 and ST2 to express gradations.

With the display device 1 according to embodiments, it is possible to improve light efficiency by adjusting the current density of the driving current applied to the same active layer of the respective light emitting elements LE1 and LE2 to selectively emit the second light or the third light.

Hereinafter, a display device 1 according to one or more other embodiments will be described with reference to other drawings.

Figure 14:
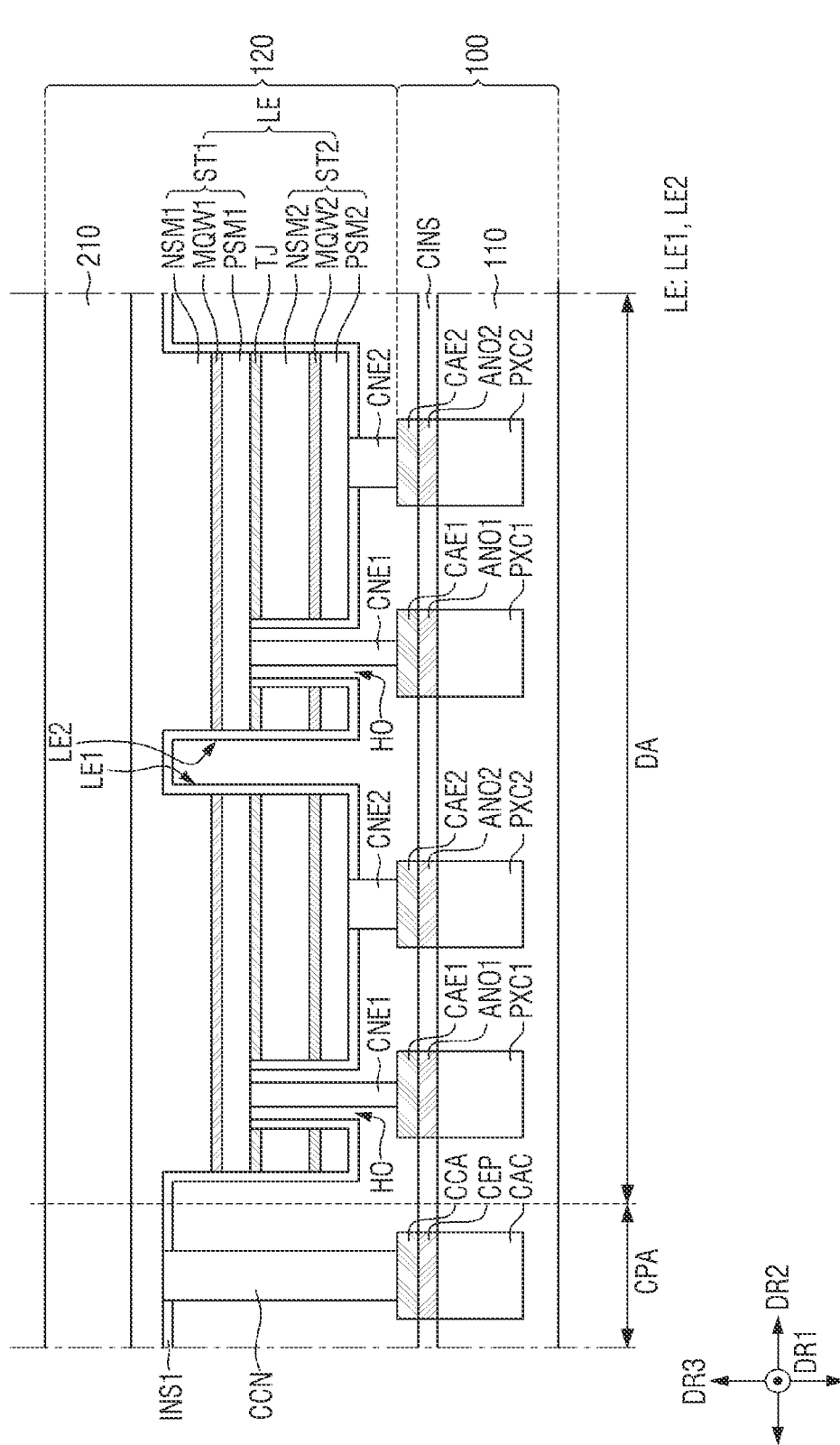
FIG. 14 is a cross-sectional view illustrating a display device according to one or more other embodiments.

FIG. 14 is a cross-sectional view illustrating a display device according to one or more other embodiments.

Referring to FIG. 14, a display device 1 according to the present embodiments is different from the display device according to the embodiments described above with reference to FIGS. 4 to 7 in that the first connection electrodes CNE1 of the respective light emitting elements LE1 and LE2 are connected (e.g., electrically coupled) to the first stacks ST1 through holes HO. Hereinafter, descriptions of the same or similar configurations will be simplified or will not be provided, and configurations different from those described above will be described in more detail.

The respective light emitting elements LE1 and LE2 may include the holes HO. The hole HO may allow the first connection electrode CNE1 to be connected to the first stack ST1. The hole HO may penetrate through the second stack ST2 to expose the first stack ST1. For example, the hole HO may penetrate through the second n-type semiconductor layer NSM2, the second active layer MQW2 or the third active layer MQW3, and the second p-type semiconductor layer PSM2 of the second stack ST2, and through the tunnel functional layer TJ. The hole HO may be positioned at one edge of the second stack ST2 or at the center of the second stack ST2, in a plan view.

The light emitting element layer 120 may further include an insulating layer INS1. The insulating layer INS1 may be provided on a lower surface and side surfaces of each of the light emitting elements LE1 and LE2. The insulating layer INS1 may insulate adjacent light emitting elements LE1 and LE2 from each other. In addition, the insulating layer INS1 may insulate the first connection electrode CNE1 formed in the hole HO from the second stack ST2 so as not to be connected to the second stack ST2.

For example, the insulating layer INS1 may be directly on a lower surface and side surfaces of the first n-type semiconductor layer NSM1 of the first stack ST1, and may be directly on side surfaces of the first active layer MQW1 and side surfaces of the first p-type semiconductor layer PSM1 of the first stack ST1. In one or more embodiments, the insulating layer INS1 may be directly on side surfaces of the tunnel functional layer TJ, side surfaces of the second n-type semiconductor layer NSM2, side surfaces of the second active layer MQW2 or the third active layer MQW3, and a lower surface and side surfaces of the second p-type semiconductor layer PSM2 of the second stack ST2.

The insulating layer INS1 may expose portions of the lower surfaces of the first p-type semiconductor layer PSM1 and the second p-type semiconductor layer PSM2 of the respective light emitting elements LE1 and LE2 to allow the first p-type semiconductor layer PSM1 and the second p-type semiconductor layer PSM2 to be in contact with the connection electrodes CNE1 and CNE2. In one or more embodiments, the insulating layer INS1 may expose a portion of a lower surface of the first n-type semiconductor layer NSM1 of the light emitting element layer 120 in the non-display area NDA to allow the first n-type semiconductor layer NSM1 to be in contact with the common connection electrode CCN.

The insulating layer INS1 may include an inorganic insulating material such as silicon oxide (SiO$_x$), silicon nitride (SiN$_x$), silicon oxynitride (SiO$_x$N$_y$), aluminum oxide (Al$_x$O$_y$), and/or aluminum nitride (AlN). A thickness of the insulating layer INS1 may be approximately 0.1 μm, but is not limited thereto.

Figure 15:
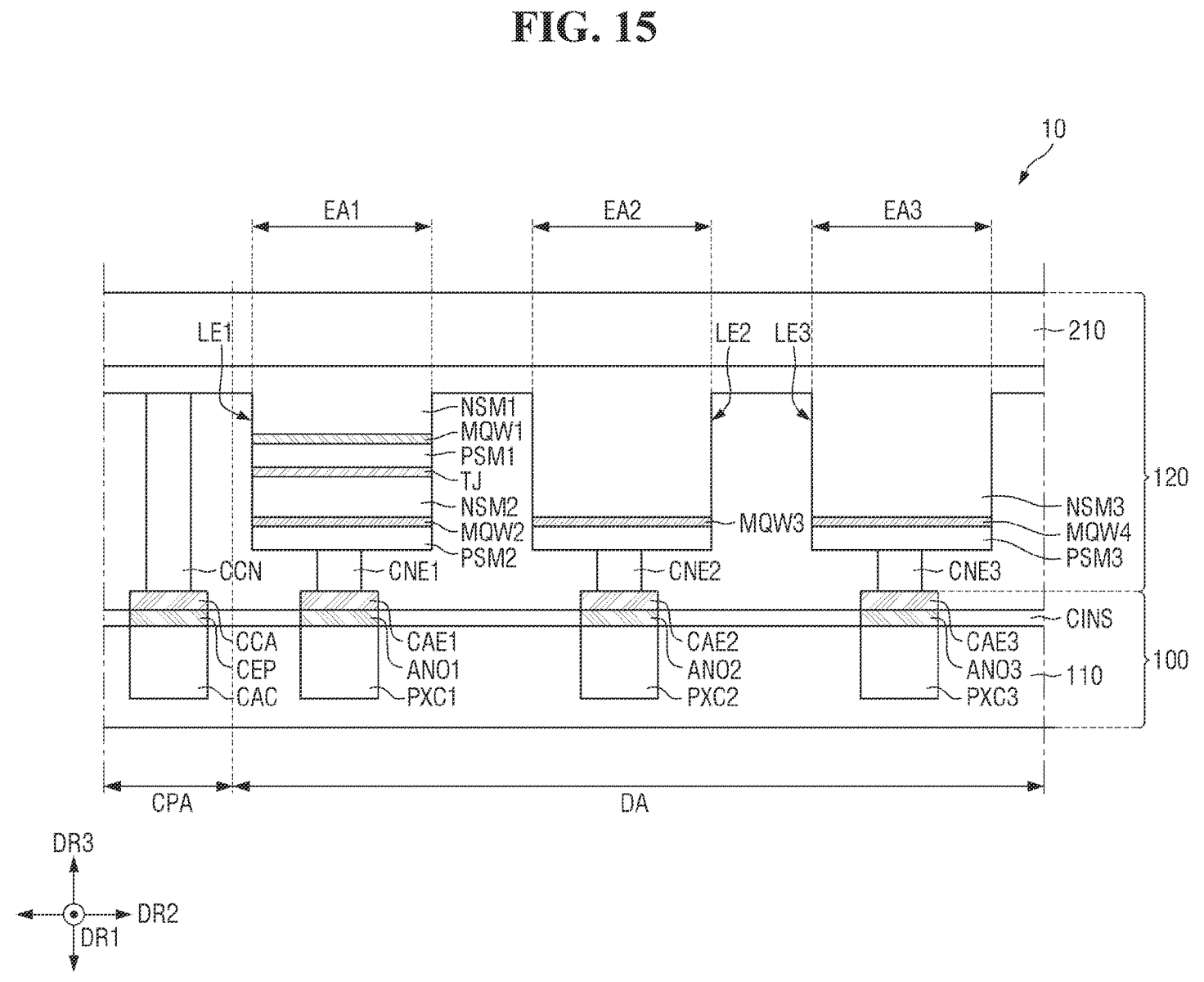
Figure 16:
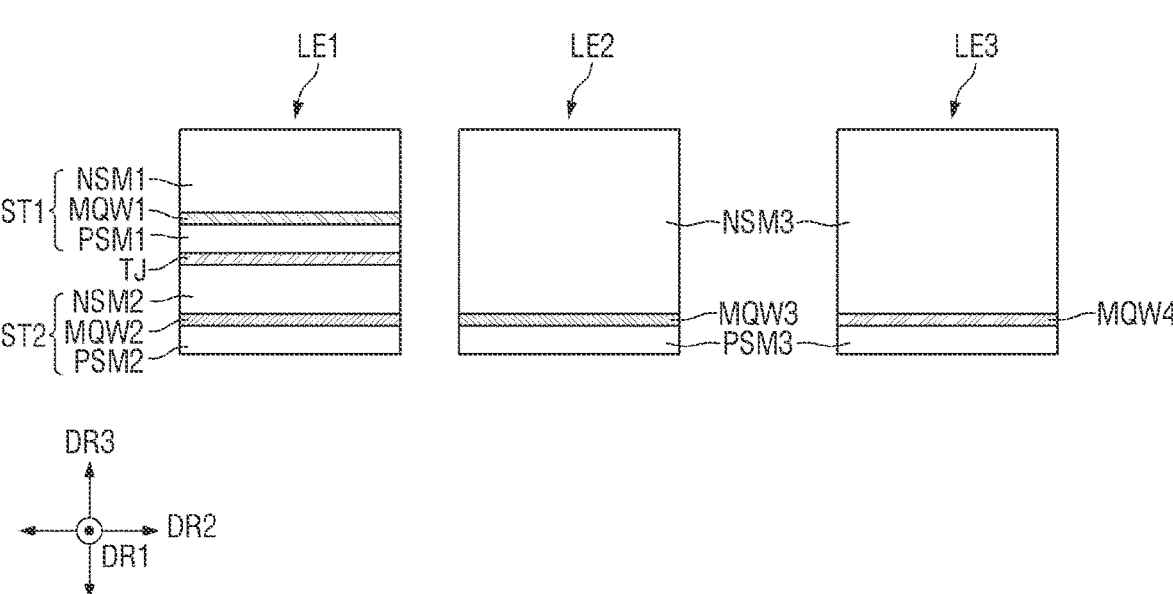
FIG. 16 is a cross-sectional view illustrating respective light emitting elements according to one or more other embodiments.
Figure 17:
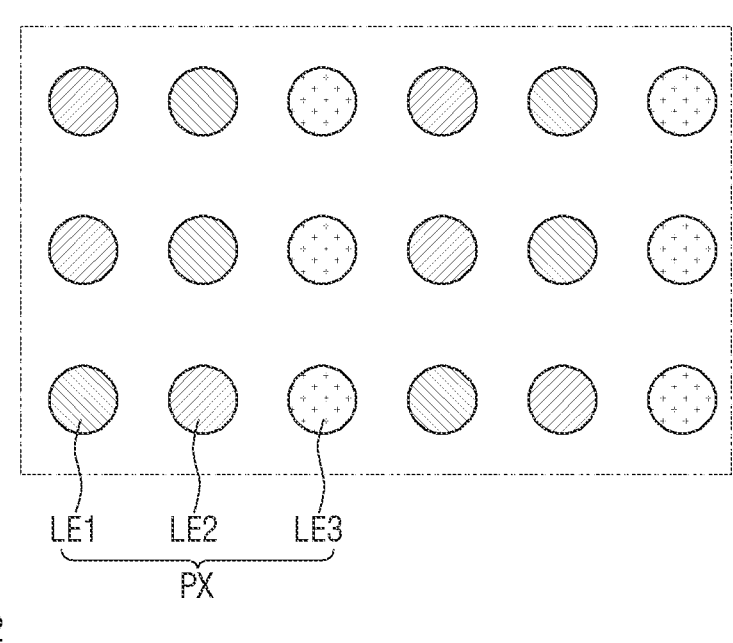
FIG. 17 is an illustrative layout diagram illustrating a layout of the respective light emitting elements.
Figure 18:
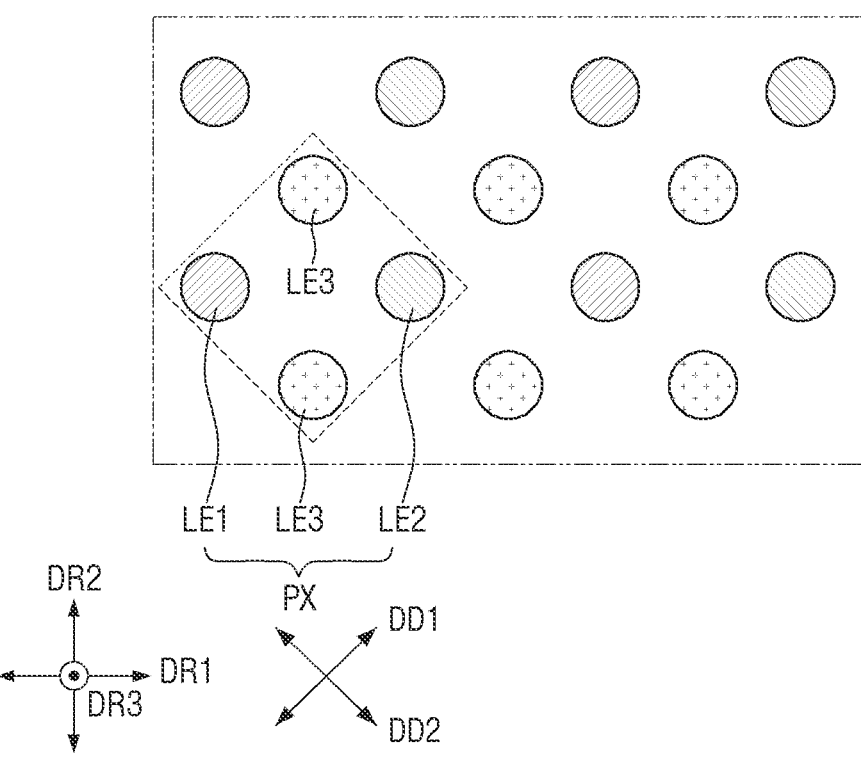
FIG. 18 is another illustrative layout diagram illustrating a layout of the respective light emitting elements.

FIG. 15 is a cross-sectional view illustrating a display device according to one or more other embodiments. FIG. 16 is a cross-sectional view illustrating respective light emitting elements according to one or more other embodiments. FIG. 17 is an illustrative layout diagram illustrating a layout of the respective light emitting elements, FIG. 18 is another illustrative layout diagram illustrating a layout of the respective light emitting elements.

Referring to FIGS. 15 to 18, a display device 1 according to the present embodiments is different from the display devices according to the embodiments described above with reference to FIGS. 4 to 14 in that a plurality of light emitting elements LE1, LE2, and LE3 constitute one pixel PX and are connected to pixel circuit parts through one connection electrode. Hereinafter, description of the same or similar configurations will be simplified or will not be provided, and configurations different from those described above will be described in more detail.

A display panel 10 according to the present embodiments may include a semiconductor circuit substrate 100 and a light emitting element layer 120.

The semiconductor circuit substrate 100 may include a first substrate 110, pixel circuit parts PXC1, PXC2, and PXC3, pixel electrodes ANO1, ANO2, and ANO3, and contact electrodes CAE1, CAE2, and CAE3.

A plurality of pixel circuit parts PXC1, PXC2, and PXC3 may be positioned in the display area DA. Each of the plurality of pixel circuit parts PXC1, PXC2, and PXC3 may be connected (e.g., electrically coupled) to each of the pixel electrodes ANO1, ANO2, and ANO3 corresponding thereto. For example, the plurality of pixel circuit parts PXC1, PXC2, and PXC3 may include first pixel circuit parts PXC1, second pixel circuit parts PXC2, and third pixel circuit parts PXC3. The first pixel circuit part PXC1 may be connected to a first light emitting element LE1 including a first active layer MQW1 and a second active layer MQW2, the second pixel circuit part PXC2 may be connected to a second light emitting element LE2 including a third active layer MQW3, and the third pixel circuit part PXC3 may be connected to a third light emitting element LE3 including a fourth active layer MQW4.

The respective pixel circuit parts PXC1, PXC2, and PXC3 may be connected to the respective pixel electrodes ANO1, ANO2, and ANO3 so as to correspond to the respective pixel electrodes ANO1, ANO2, and ANO3 in a one-to-one manner. The pixel circuit parts PXC1, PXC2, and PXC3 may overlap the light emitting elements LE1, LE2, and LE3, respectively, in the third direction DR3.

A plurality of pixel electrodes ANO1, ANO2, and ANO3 may be on the pixel circuit parts PXC1, PXC2, and PXC3 corresponding thereto, respectively. A first pixel electrode ANO1 may be on the first pixel circuit part PXC1, a second pixel electrode ANO2 may be on the second pixel circuit part PXC2, and a third pixel electrode ANO3 may be on the second pixel circuit part PXC3.

The contact electrodes CAE1, CAE2, and CAE3 may be on the pixel electrodes ANO1, ANO2, and ANO3 corresponding thereto, respectively. For example, a first contact electrode CAE1 may be on the first pixel electrode ANO1, a second contact electrode CAE2 may be on the second pixel electrode ANO2, and a third contact electrode CAE3 may be on the third pixel electrode ANO3.

The contact electrodes CAE1, CAE2, and CAE3 may adhere the pixel electrodes ANO1, ANO2, and ANO3 to the light emitting elements LE1, LE2, and LE3, respectively.

The light emitting element layer 120 may include a second substrate 210, first to third light emitting elements LE1, LE2, and LE3, and connection electrodes CNE1, CNE2, and CNE3.

Each of the light emitting elements LE1, LE2, and LE3 may be on one surface of the second substrate 210. The first light emitting element LE1 may include a first stack ST1 including the first active layer MQW1 emitting (e.g., configured to emit) second light, and a second stack ST2 including the second active layer MQW2 emitting (e.g., configured to emit) the second light. The second light emitting element LE2 may include the third active layer MQW3 emitting (e.g., configured to emit) third light, and the third light emitting element LE3 may include the fourth active layer MQW4 emitting (e.g., configured to emit) first light.

The first light emitting element LE1 may include a first emission area EA1 from which the second light is emitted, the second light emitting element LE2 may include a second emission area EA2 from which the third light is emitted, and the third light emitting element LE3 may include a third emission area EA3 from which the first light is emitted. The emission areas EA1, EA2, and EA3 of the respective light emitting elements LE1, LE2, and LE3 may have the same area or different areas.

Referring to FIG. 16, the first light emitting element LE1 may include the first stack ST1 and the second stack ST2. The first stack ST1 may include the first active layer MQW1 emitting (e.g., configured to emit) the second light, and the second stack ST2 may include the second active layer MQW2 emitting (e.g., configured to emit) the second light.

For example, the first stack ST1 may include a first n-type semiconductor layer NSM1, a first p-type semiconductor layer PSM1, and the first active layer MQW1 interposed between the first n-type semiconductor layer NSM1 and the first p-type semiconductor layer PSM1. The first active layer MQW1 may emit second light having a central wavelength band in the range of about 610 nm to about 650 nm, for example, light of a red wavelength band. The second stack ST2 may include a second n-type semiconductor layer NSM2, a second p-type semiconductor layer PSM2, and the second active layer MQW2 interposed between the second n-type semiconductor layer NSM2 and the second p-type semiconductor layer PSM2. The second active layer MQW2 may emit second light having a central wavelength band in the range of about 610 nm to about 650 nm, for example, light of a red wavelength band. The first active layer MQW1 and the second active layer MQW2 may include the same material to emit the same second light. A tunnel functional layer TJ may be provided between the first stack ST1 and the second stack ST2.

The second light emitting element LE2 may include the third active layer MQW3 emitting (e.g., configured to emit) the third light. The second light emitting element LE2 may include a third n-type semiconductor layer NSM3, a third p-type semiconductor layer PSM3, and the third active layer MQW3 interposed between the third n-type semiconductor layer NSM3 and the third p-type semiconductor layer PSM3. The third n-type semiconductor layer NSM3 may include the same material as the first n-type semiconductor layer NSM1, and the third p-type semiconductor layer PSM3 may include the same material as the first p-type semiconductor layer PSM1. The third active layer MQW3 may emit third light having a central wavelength band in the range of about 510 nm to about 550 nm, for example, light of a green wavelength band. A content of indium (In) in the third active layer MQW3 may be lower than that of indium (In) in the first active layer MQW1. For example, the content of indium (In) in the third active layer MQW3 may be approximately 25%.

The third light emitting element LE3 may include the fourth active layer MQW4 emitting (e.g., configured to emit) the first light. The third light emitting element LE3 may include a third n-type semiconductor layer NSM3, a third p-type semiconductor layer PSM3, and the fourth active layer MQW4 interposed between the third n-type semiconductor layer NSM3 and the third p-type semiconductor layer PSM3. The fourth active layer MQW4 may emit first light having a central wavelength band in the range of about 450 nm to about 495 nm, for example, light of a blue wavelength band. A content of indium (In) in the fourth active layer MQW4 may be lower than that of indium (In) in each of the first active layer MQW1 and the third active layer MQW3. For example, the content of indium (In) in the fourth active layer MQW4 may be approximately 15%.

The first light emitting element LE1 emits the second light, the second light emitting element LE2 emits the third light, and the third light emitting element LE3 emits the first light, such that a full color may be implemented in one pixel PX.

In one or more embodiments, the light emitting element layer 120 may include a plurality of connection electrodes CNE1, CNE2, and CNE3. The light emitting element layer 120 may include first connection electrodes CNE1, second connection electrodes CNE2, and third connection electrodes CNE3. The first connection electrode CNE1 may connect the first light emitting element LE1 and the first contact electrode CAE1 to each other to supply an anode voltage so that the first active layer MQW1 and the second active layer MQW2 may emit light. The second connection electrode CNE2 may connect the second light emitting element LE2 and the second contact electrode CAE2 to each other to supply an anode voltage so that the third active layer MQW3 may emit light. The third connection electrode CNE3 may connect the third light emitting element LE3 and the third contact electrode CAE3 to each other to supply an anode voltage so that the fourth active layer MQW4 may emit light.

As described above, each of the plurality of pixels PX of the display panel 10 may display various colors without a wavelength conversion layer by including the first light emitting element LE1 emitting the second light, the second light emitting element LE2 emitting the third light, and the third light emitting element LE3 emitting the first light. In one or more embodiments, the first light emitting element LE1 may include two active layers emitting the same second light to improve efficiency of the second light.

As illustrated in FIG. 17, the first light emitting elements LE1, the second light emitting elements LE2, and the third light emitting elements LE3 may be alternately arranged with each other in the first direction DR1. For example, the first light emitting elements LE1, the second light emitting elements LE2, and the third light emitting elements LE3 may be in the order of the first light emitting element LE1, the second light emitting element LE2, and the third light emitting element LE3 in the first direction DR1. In addition, in each of the plurality of pixels PX, the first light emitting element LE1, the second light emitting element LE2, and the third light emitting element LE3 may be arranged in the first direction DR1. The first light emitting elements LE1 may be arranged in the second direction DR2. The second light emitting elements LE2 may be arranged in the second direction DR2. The third light emitting elements LE3 may be arranged in the second direction DR2.

In some embodiments, as illustrated in FIG. 18, each pixel PX may include a first light emitting element LE1, a second light emitting element LE2, and two third light emitting elements LE3. The first light emitting elements LE1 and the second light emitting elements LE2 may be alternately arranged with each other in the first direction DR1 and may be repeatedly arranged with each other in the second direction DR2. The third light emitting elements LE3 may be repeatedly arranged with each other in the first direction DR1 and the second direction DR2.

In addition, the first light emitting elements LE1, the second light emitting elements LE2, and the third light emitting elements LE3 may be alternately arranged in a first diagonal direction DD1 and a second diagonal direction DD2. The first diagonal direction DD1 may be a diagonal direction between the first and second directions DR1 and DR2, and the second diagonal direction DD2 may be a direction orthogonal to the first diagonal direction DD1.

In each of the plurality of pixels PX, the first light emitting element LE1 and the second light emitting element LE2 may be arranged in the first direction DR1, and the third light emitting elements LE3 may be arranged in the second direction DR2. In each of the plurality of pixels PX, the first light emitting element LE1 and one third light emitting element LE3 may be arranged in the first diagonal direction DD1, the first light emitting element LE1 and the other third light emitting element LE3 may be arranged in the second diagonal direction DD2, and the second light emitting element LE2 and the third light emitting elements LE3 may be arranged in the first diagonal direction DD1 and the second diagonal direction DD2.

Figure 19:
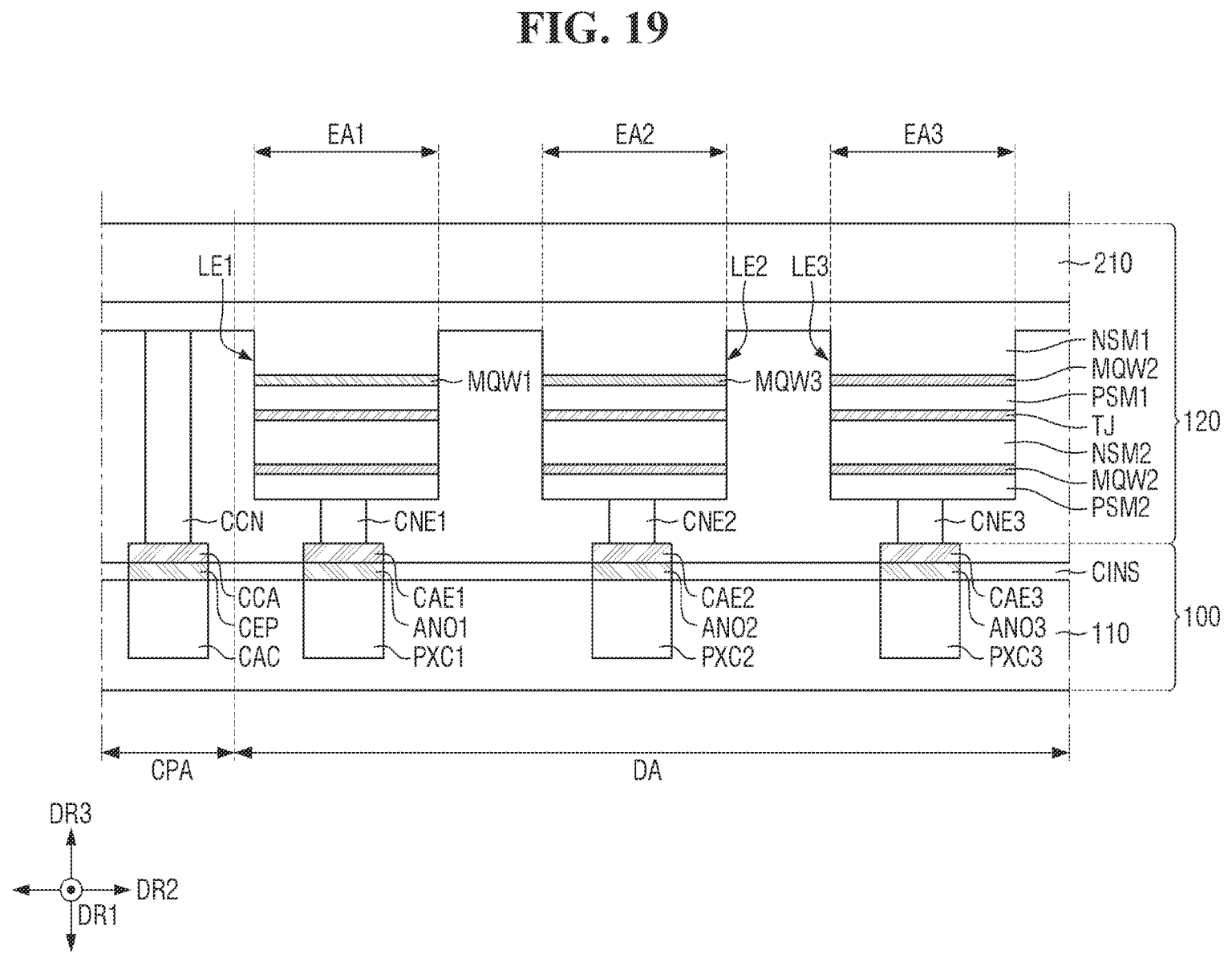
Figure 20:
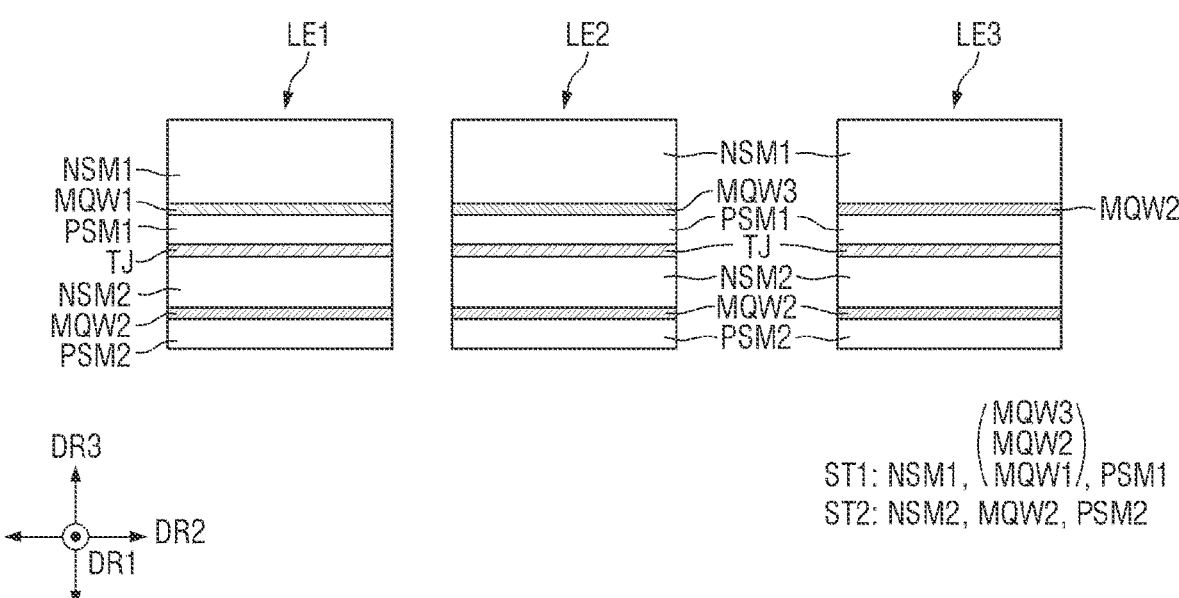
FIG. 20 is a cross-sectional view illustrating respective light emitting elements according to one or more other embodiments.

FIG. 19 is a cross-sectional view illustrating a display device according to one or more other embodiments. FIG. 20 is a cross-sectional view illustrating respective light emitting elements according to one or more other embodiments.

Referring to FIGS. 19 and 20, a display device 1 according to the present embodiments is different from the display device according to one or more other embodiments described above with reference to FIGS. 15 and 16 in that each of a plurality of light emitting elements LE1, LE2, and LE3 is configured by stacking a first stack and a second stack. Hereinafter, descriptions of the same or similar configurations will be simplified or will not be provided, and configurations different from those described above will be described in more detail.

Each of the light emitting elements LE1, LE2, and LE3 may be on one surface of the second substrate 210. The first light emitting element LE1 may include a first stack ST1 including a first active layer MQW1 emitting first light and a second stack ST2 including a second active layer MQW2 emitting second light. The second light emitting element LE2 may include a first stack ST1 including a third active layer MQW3 emitting third light and a second stack ST2 including a second active layer MQW2 emitting second light. The third light emitting element LE3 may include a first stack ST1 including a second active layer MQW2 emitting second light and a second stack ST2 including a second active layer MQW2 emitting second light. A tunnel functional layer TJ may be provided between the respective stacks ST1 and ST2.

The first light emitting element LE1 may include a first emission area EA1 from which the first light and the second light are emitted, the second light emitting element LE2 may include a second emission area EA2 from which the second light and the third light are emitted, and the third light emitting element LE3 may include a third emission area EA3 from which the second light is emitted, however, one or more embodiments of the present disclosure are not limited thereto. In another embodiment, the second light emitting element LE2 may include a first stack ST1 including a third active layer MQW3 emitting the third light and a second stack ST2 including a third active layer MQW3 emitting the third light, and the third light emitting element LE3 may include a first stack ST1 including a second active layer MQW2 emitting the second light and a second stack ST2 including a second active layer MQW2 emitting the second light. In another embodiment, the second light emitting element LE2 may include a first stack ST1 including a third active layer MQW3 emitting the third light and a second stack ST2 including a second active layer MQW2 emitting the second light, and the third light emitting element LE3 may include a first stack ST1 including a third active layer MQW3 emitting the third light and a second stack ST2 including a second active layer MQW2 emitting the second light. The emission areas EA1, EA2, and EA3 of the respective light emitting elements LE1, LE2, and LE3 may have the same area or different areas.

In the present embodiments, the pixel PX may be constituted by three light emitting elements LE1, LE2, and LE3, and all of the light emitting elements LE1, LE2, and LE3 may include the second active layers MQW2 emitting the second light to improve efficiency of the second light.

Figure 21:
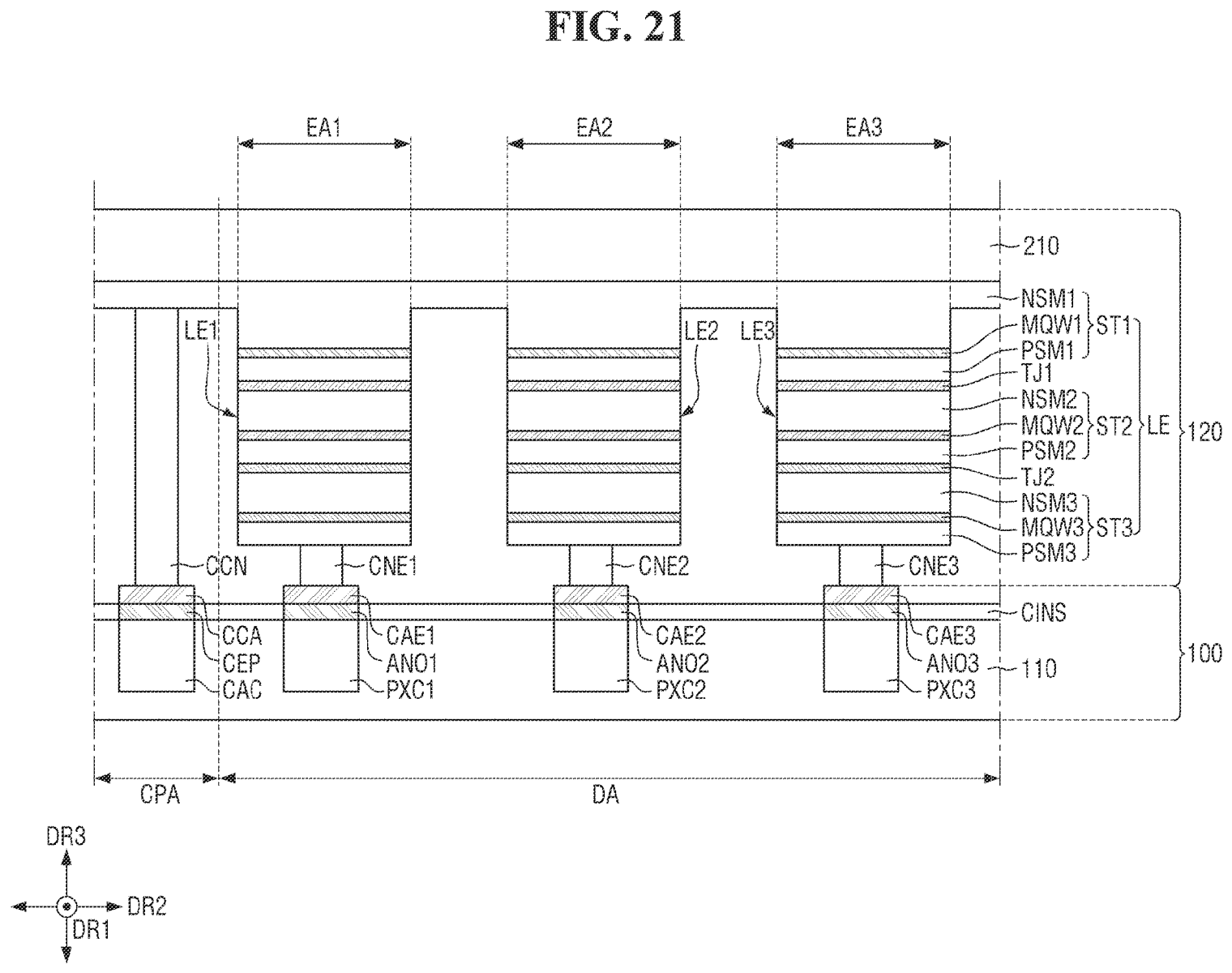
Figure 22:
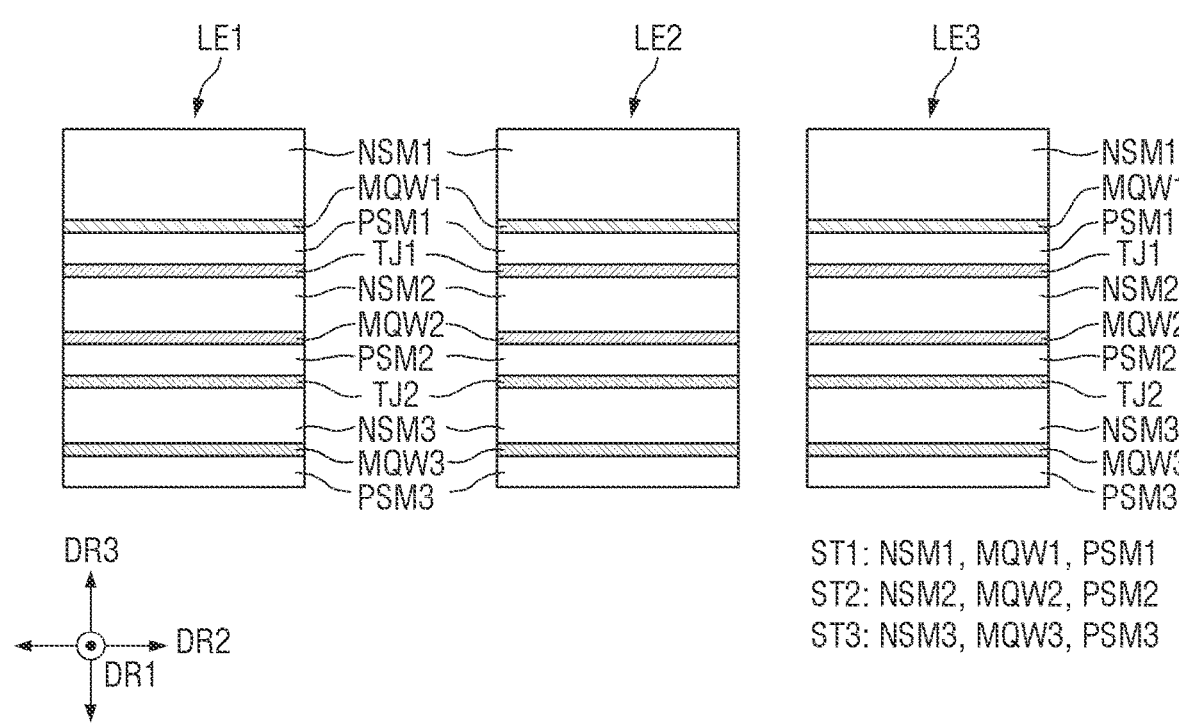
FIG. 22 is a cross-sectional view illustrating respective light emitting elements according to one or more other embodiments.

FIG. 21 is a cross-sectional view illustrating a display device according to one or more other embodiments. FIG. 22 is a cross-sectional view illustrating respective light emitting elements according to one or more other embodiments.

Referring to FIGS. 21 and 22, a display device 1 according to the present embodiment is different from the display device according to one or more other embodiments described above with reference to FIGS. 19 and 20 in that each of a plurality of light emitting elements LE1, LE2, and LE3 is configured by stacking a first stack, a second stack, and a third stack that emit different light. Hereinafter, descriptions of the same or similar configurations will be simplified or will not be provided, and configurations different from those described above will be described in more detail.

Each of the light emitting elements LE1, LE2, and LE3 may include a first stack ST1 including a first active layer MQW1 emitting first light, a second stack ST2 including a second active layer MQW2 emitting second light, and a third stack ST3 including a third active layer MQW3 emitting third light.

The stacks ST1, ST2, and ST3 may include n-type semiconductor layers NSM1, NSM2, and NSM3 and p-type semiconductor layers PSM1, PSM2, and PMS3, respectively. The first stack ST1 may include the first active layer MQW1 interposed between a first n-type semiconductor layer NSM1 and a first p-type semiconductor layer PSM1. The second stack ST2 may include the second active layer MQW2 interposed between a second n-type semiconductor layer NSM2 and a second p-type semiconductor layer PSM2. The third stack ST3 may include the third active layer MQW3 interposed between a third n-type semiconductor layer NSM3 and a third p-type semiconductor layer PSM3. A first tunnel functional layer TJ1 may be between the first stack ST1 and the second stack ST2, and a second tunnel functional layer TJ2 may be between the second stack ST2 and the third stack ST3.

The first light emitting element LE1 may include a first emission area EA1 from which the first light, the second light, and the third light are emitted, the second light emitting element LE2 may include a second emission area EA2 from which the first light, the second light, and the third light are emitted, and the third light emitting element LE3 may include a third emission area EA3 from which the first light, the second light, and the third light are emitted. The emission areas EA1, EA2, and EA3 of the respective light emitting elements LE1, LE2, and LE3 may have the same area or different areas.

In the present embodiments, the pixel PX may be constituted by three light emitting elements LE1, LE2, and LE3, and each of the light emitting elements LE1, LE2, and LE3 may include the first to third active layers MQW1, MQW2, and MQW3 emitting (e.g., configured to emit) the first light, the second light, and the third light. Accordingly, a full color may be implemented in the pixel PX, and when efficiency of a set or specific light is decreased, each of the light emitting elements LE1, LE2, and LE3 may further emit the set or specific light to improve the efficiency of the set or specific light.

Hereinafter, processes of manufacturing a display device 1 according to one or more embodiments will be described with reference to other drawings.

Figure 23:
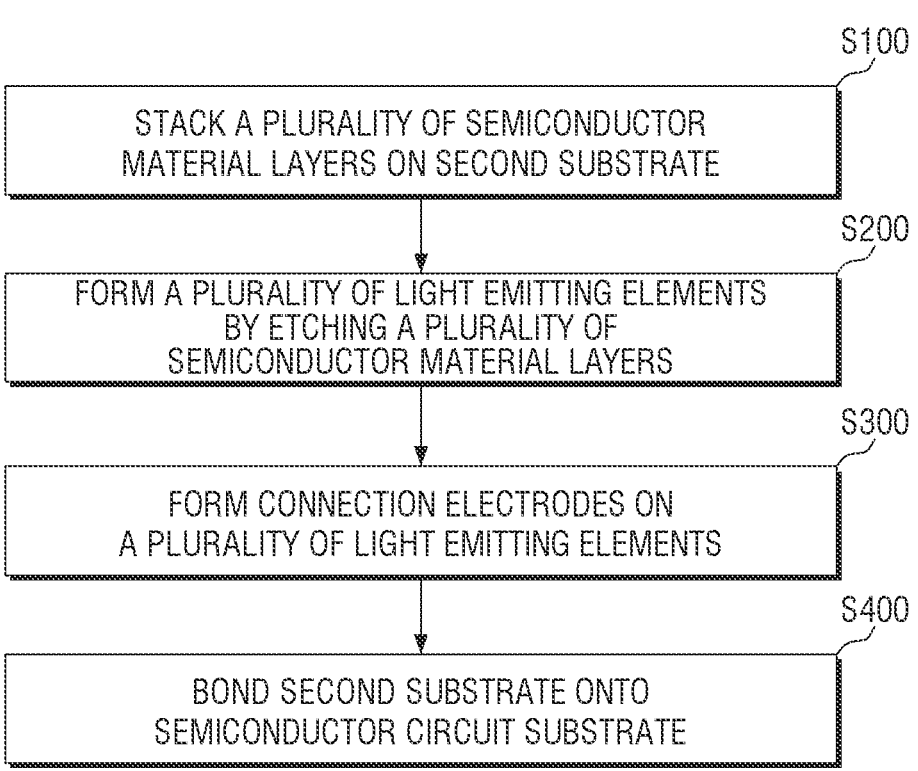
FIG. 23 is a flowchart illustrating a method of manufacturing a display device according to one or more embodiments.

FIG. 23 is a flowchart illustrating a method of manufacturing a display device according to one or more embodiments. FIGS. 24 to 32 are cross-sectional views for describing the method of manufacturing a display device according to one or more embodiments.

FIGS. 24 to 32 illustrate structures according to formation order of respective layers of the display panel 10 of the display device 1 as cross-sectional views. Processes of manufacturing the light emitting element layer 120 are mainly illustrated in FIGS. 24 to 32, and these processes may correspond to portions of the cross-sectional view of FIG. 4. Hereinafter, a method of manufacturing a display device illustrated in FIGS. 24 to 32 will be described in conjunction with FIG. 23.

Figure 24:
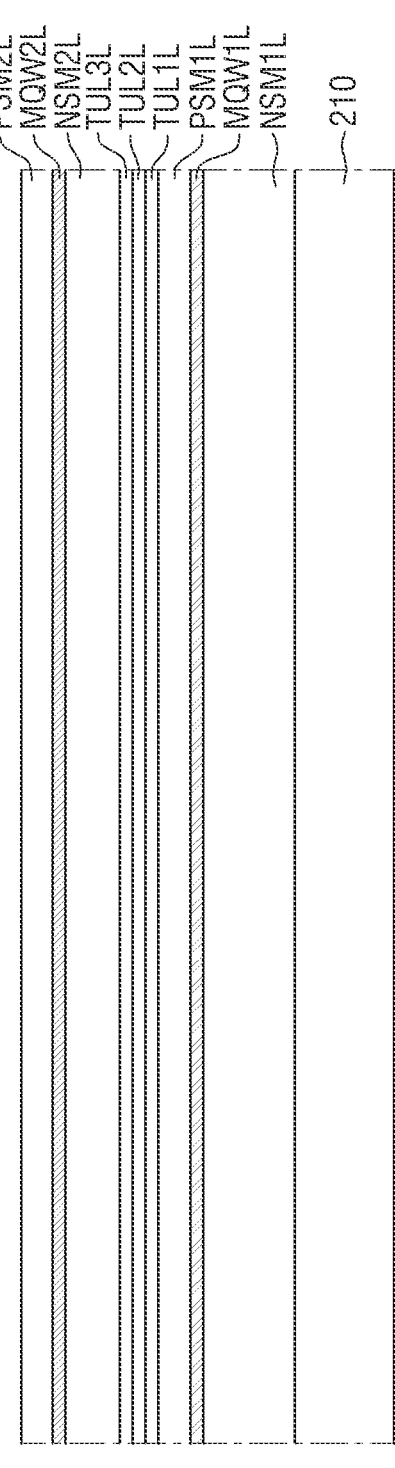

Referring to FIG. 24, a plurality of semiconductor material layers NSM1, MQW1L, PSM1L, TUL1L, TUL2L, TUL3L, NSM2L, MQW2L, and PSM2L are formed on a second substrate 210, which is a base substrate (S100 in FIG. 23).

First, the second substrate 210 is prepared. The second substrate 210 may be a sapphire substrate ($Al_2O_3$) or a silicon wafer including silicon. However, the present disclosure is not limited thereto, and a case where the second substrate 210 is the sapphire substrate will be described by way of example in one or more embodiments.

The plurality of semiconductor material layers NSM1, MQW1L, PSM1L, TUL1L, TUL2L, TUL3L, NSM2L, MQW2L, and PSM2L are formed on the second substrate 210. The plurality of semiconductor material layers NSM1, MQW1L, PSM1L, TUL1L, TUL2L, TUL3L, NSM2L, MQW2L, and PSM2L grown by an epitaxial method may be formed by growing seed crystals. Here, a method of forming the semiconductor material layers may be electron beam deposition, physical vapor deposition (PVD), chemical vapor deposition (CVD), plasma laser deposition (PLD), dual-type thermal evaporation, sputtering, metal organic chemical vapor deposition (MOCVD), and in some embodiments, metal-organic chemical vapor deposition (MOCVD). However, the present disclosure is not limited thereto.

A precursor material for forming the plurality of semiconductor material layers NSM1, MQW1L, PSM1L, TUL1L, TUL2L, TUL3L, NSM2L, MQW2L, and PSM2L is not particularly limited as long as it is a suitable target material. As an example, the precursor material may be a metal precursor including an alkyl group such as a methyl group and/or an ethyl group. For example, the precursor material may be a compound such as trimethyl gallium ($Ga(CH_3)_3$), trimethyl aluminum ($Al(CH_3)_3$), and/or triethyl phosphate ($(C_2H_5)_3PO_4$), but is not limited thereto.

For example, a first n-type semiconductor material layer NSM1L is formed on the second substrate 210. A first active material layer MQW1L, a first p-type semiconductor material layer PSM1L, a first tunnel material layer TUL1L, a second tunnel material layer TUL2L, a third tunnel material layer TUL3L, a second n-type semiconductor material layer NSM2L, a second active material layer MQW2L, and a second p-type semiconductor material layer PSM2L are sequentially formed on the first n-type semiconductor material layer NSM1L using the above-described method.

It has been illustrated in FIG. 24 that the first n-type semiconductor material layer NSM1L is directly formed on the second substrate 210, but the present disclosure is not limited thereto, and an undoped semiconductor layer may be further formed in order to decrease a difference in lattice constant between the first n-type semiconductor material layer NSM1L and the second substrate 210.

Next, a plurality of light emitting elements LE are formed by etching the plurality of semiconductor material layers NSM1, MQW1L, PSM1L, TUL1L, TUL2L, TUL3L, NSM2L, MQW2L, and PSM2L (S200 in FIG. 23).

Figure 25:
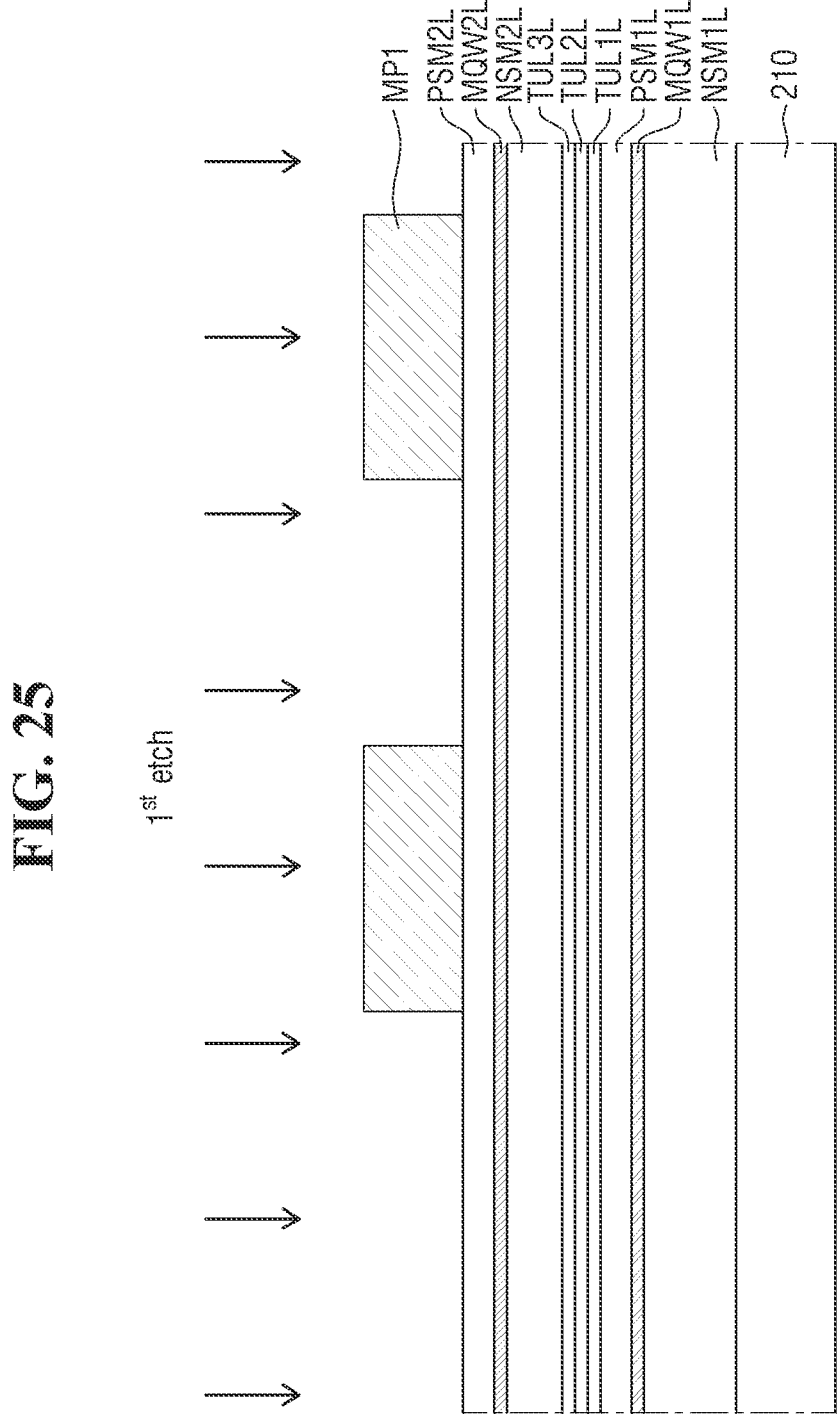
Figure 26:
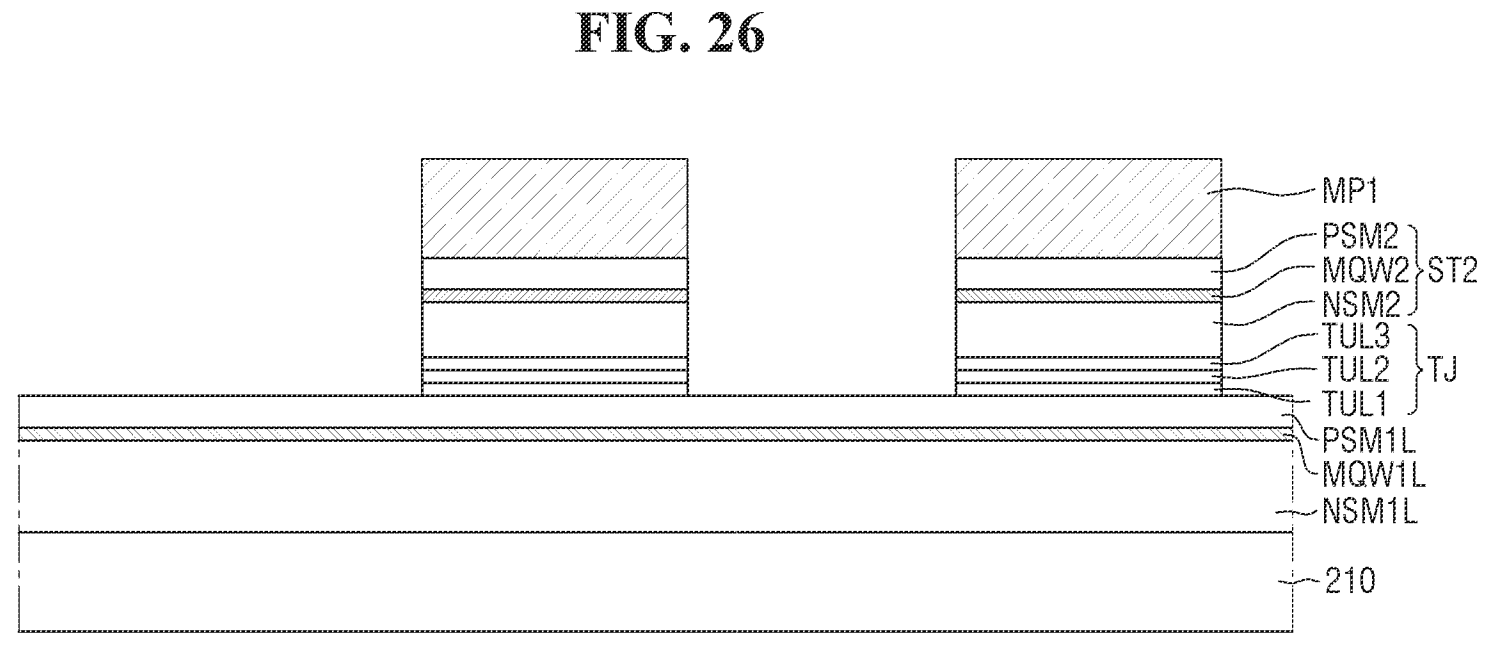

Referring to FIGS. 25 and 26, a plurality of first mask patterns MP1 are formed on the second p-type semiconductor material layer PSM2L. The first mask pattern MP1 may be a hard mask including an inorganic material or a photoresist mask including an organic material. The first mask patterns MP1 prevent or reduce the etching of the semiconductor material layers NSM1, MQW1L, PSM1L, TUL1L, TUL2L, TUL3L, NSM2L, MQW2L, and PSM2L therebelow. Next, portions of the plurality of semiconductor material layers NSM1, MQW1L, PSM1L, TUL1L, TUL2L, TUL3L, NSM2L, MQW2L, and PSM2L are etched ($1^{st}$ etch) using the plurality of first mask patterns MP1 as masks.

In the etching process ($1^{st}$ etch), the second n-type semiconductor material layer NSM2L, the second active material layer MQW3L, and the second p-type semiconductor material layer PSM3L may be etched and patterned, and the first tunnel material layer TUL1L, the second tunnel material layer TUL2L, and the third tunnel material layer TUL3L in contact with the second n-type semiconductor material layer NSM2L may be etched and patterned. The first n-type semiconductor material layer NSM1L, the first active material layer MQW1L, and the first p-type semiconductor material layer PSM1L are not etched by adjusting a time of the etching process ($1^{st}$ etch).

The semiconductor material layers may be etched by any suitable method. For example, a process of etching the semiconductor material layers may be dry etching, wet etching, reactive ion etching (RIE), deep reactive ion etching (DRIE), inductively coupled plasma reactive ion etching (ICP-RIE), and/or the like. In a case of the dry etching, anisotropic etching is possible, and the dry etching may thus be suitable for vertical etching. When the above-described etching method is used, an etchant may be $Cl_2$, $O_2$, and/or the like. However, the present disclosure is not limited thereto.

Accordingly, the second stacks ST2 including the second p-type semiconductor layers PSM2, the second active layers MQW2, and the second n-type semiconductor layers NSM2 and the tunnel functional layers TJ including the third tunnel layers TUL3, the second tunnel layers TUL2, and the first tunnel layers TUL1 are formed below the first mask patterns MP1. After the etching process ($1^{st}$ etch) ends, the first mask patterns MP1 are stripped and removed.

Figure 27:
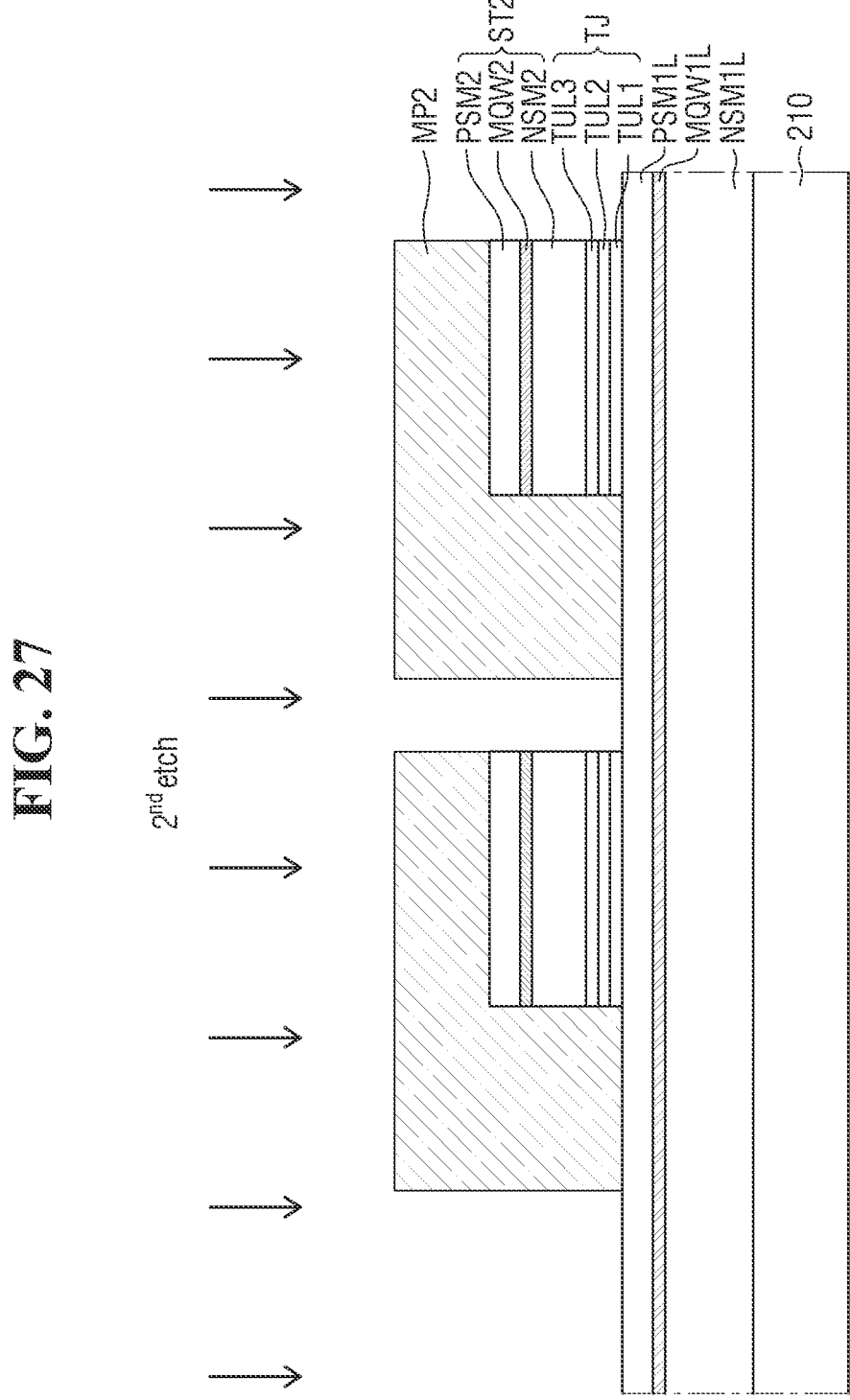
Figure 28:
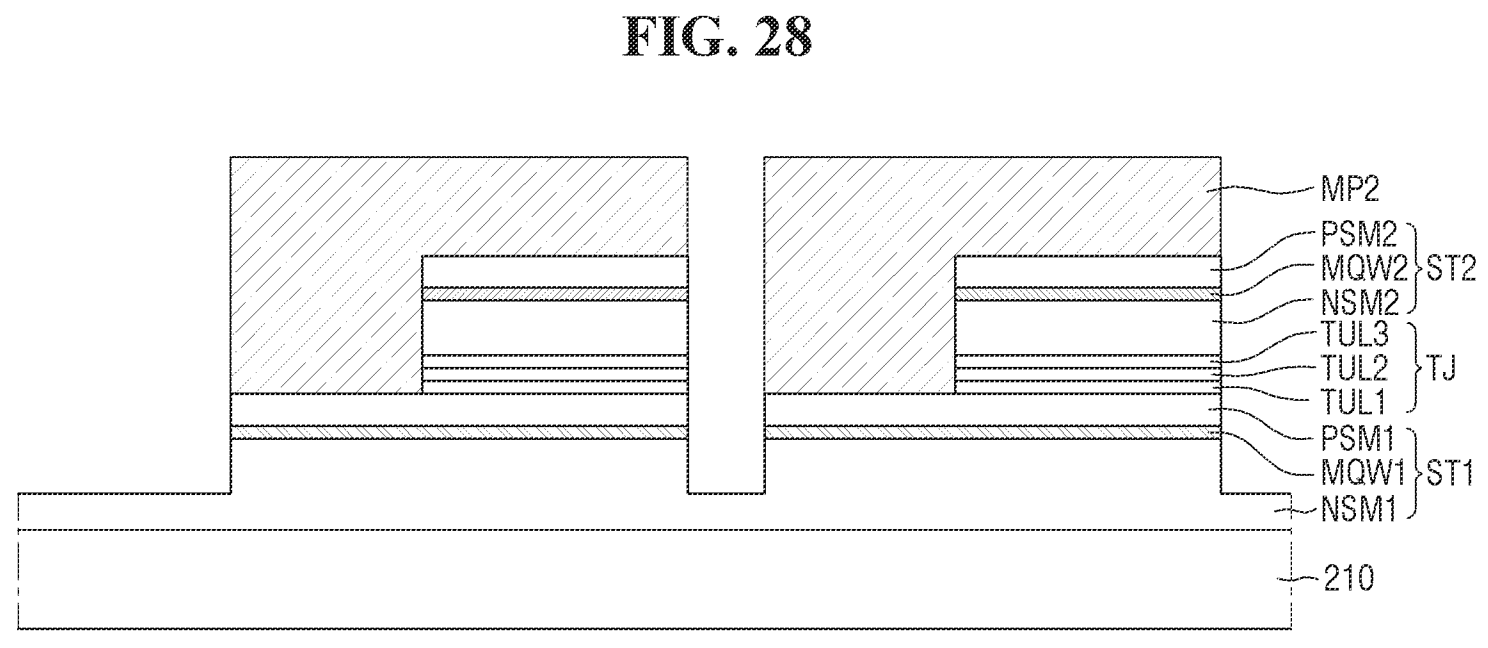

Next, referring to FIGS. 27 and 28, a plurality of second mask patterns MP2 are formed on the second p-type semiconductor layers PSM2 of the second stacks ST2 and the first p-type semiconductor material layer PSM1L. Next, portions of the plurality of semiconductor material layers NSM1, MQW1L, and PSM1L are etched ($2^{nd}$ etch) using the plurality of second mask patterns MP2 as masks.

In the etching process ($2^{nd}$ etch), the first n-type semiconductor material layer NSM1L, the first active material layer MQW1L, and the first p-type semiconductor material layer PSM1L are etched and patterned. The first n-type semiconductor material layer NSM1L is not etched up to a set or predetermined thickness by adjusting a time of the etching process ($2^{nd}$ etch), and thus, may act as a common layer.

Figure 29:
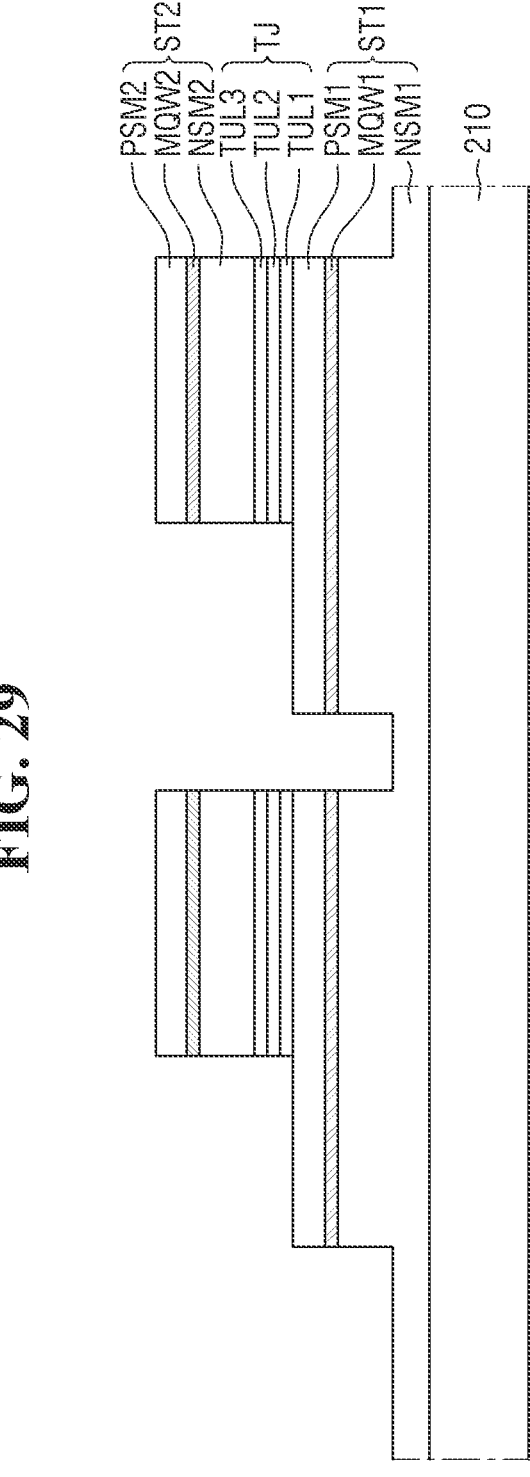

Accordingly, the first stacks ST1 including the first p-type semiconductor layers PSM1, the first active layers MQW1, and the first n-type semiconductor layers NSM1 are formed below the second mask patterns MP2. After the etching process ($2^{nd}$ etch) ends, the second mask patterns MP2 is stripped and removed to form a plurality of light emitting elements LE1 and LE2 as illustrated in FIG. 29. The plurality of light emitting elements LE1 and LE2 are arranged to be spaced apart from each other, but the first n-type semiconductor layers NSM1 of the first stacks ST1 may be connected to each other to act as a common layer.

Next, a plurality of connection electrodes CNE1 and CNE2 and a common connection electrode CCN are formed on the plurality of light emitting elements LE1 and LE2 (S300 in FIG. 23).

Figure 30:
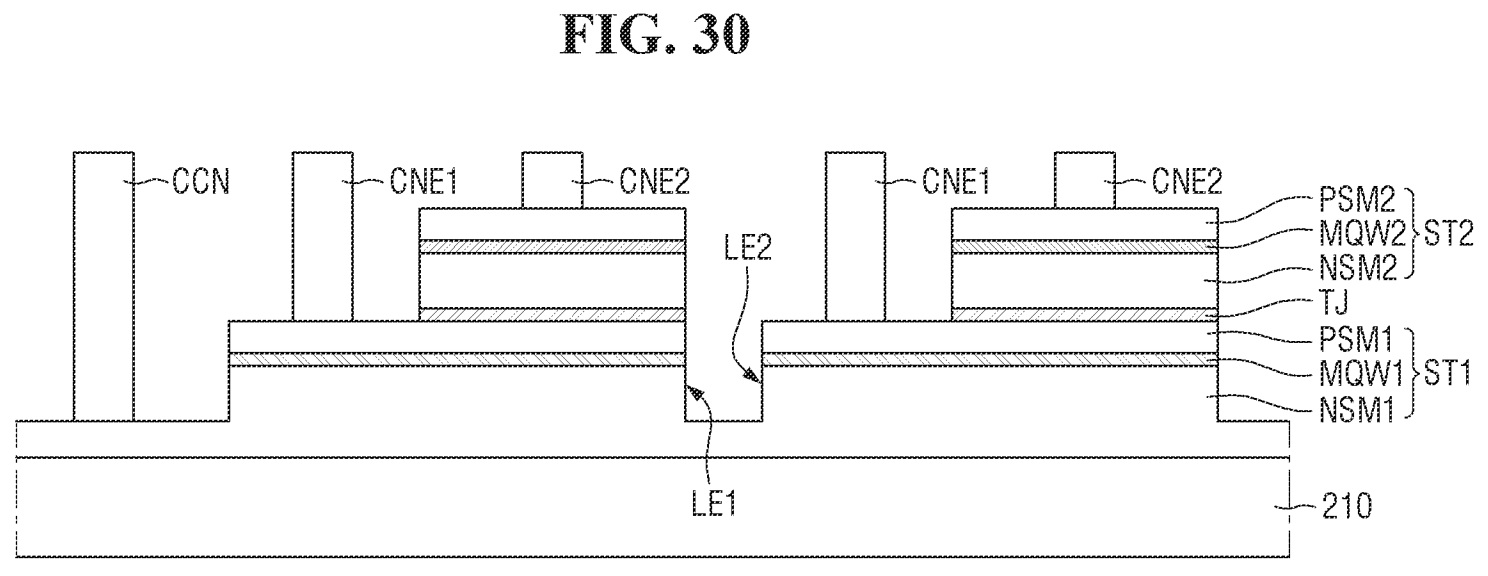

Referring to FIG. 30, the connection electrodes CNE1 and CNE2 are formed on the plurality of light emitting elements LE1 and LE2 and the common connection electrode CCN is formed on the first n-type semiconductor layer NSM1, by stacking a connection electrode material layer on the second substrate 210 and etching the connection electrode material layer.

First connection electrodes CNE1 of the connection electrodes CNE1 and CNE2 are formed on the first stacks ST1 of the respective light emitting elements LE1 and LE2, and are directly formed on the first p-type semiconductor layers PSM1 of the first stacks ST1. The second connection electrodes CNE2 are formed on the second stacks ST2, and are directly formed on the second p-type semiconductor layers PSM2 of the second stacks ST2. The common connection electrode CCN is formed directly on the first n-type semiconductor layer NSM1 of the first stack ST1, and is formed to surround an edge of the first n-type semiconductor layer NSM1. Accordingly, the light emitting element layer 120 in which the plurality of light emitting elements LE1 and LE2, the connection electrodes CNE1 and CNE2, and the common connection electrode CCN are formed is formed on the second substrate 210.

Next, the light emitting element layer 120 is bonded onto the semiconductor circuit substrate 100 (S400 in FIG. 23).

Figure 31:
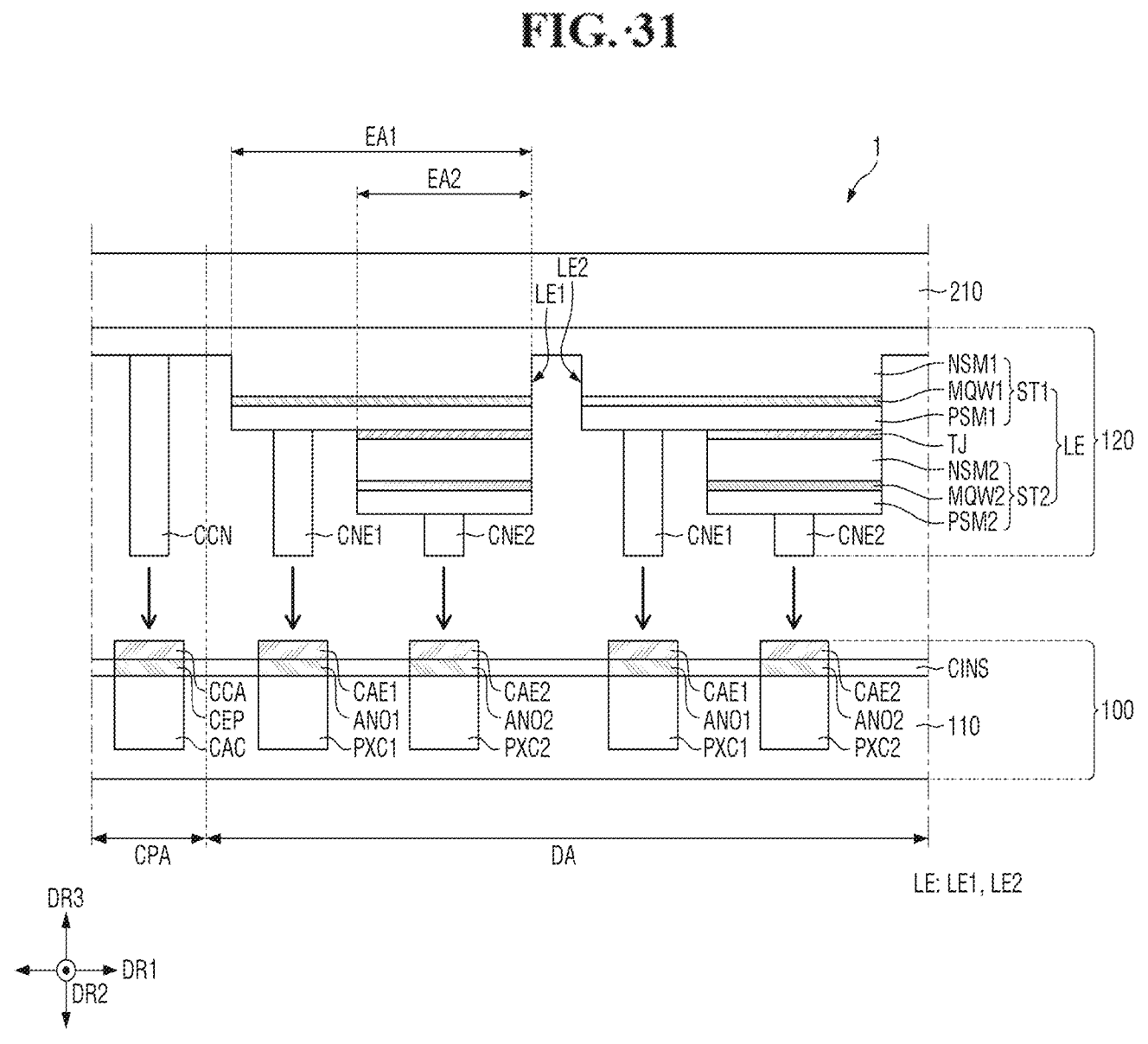
Figure 32:
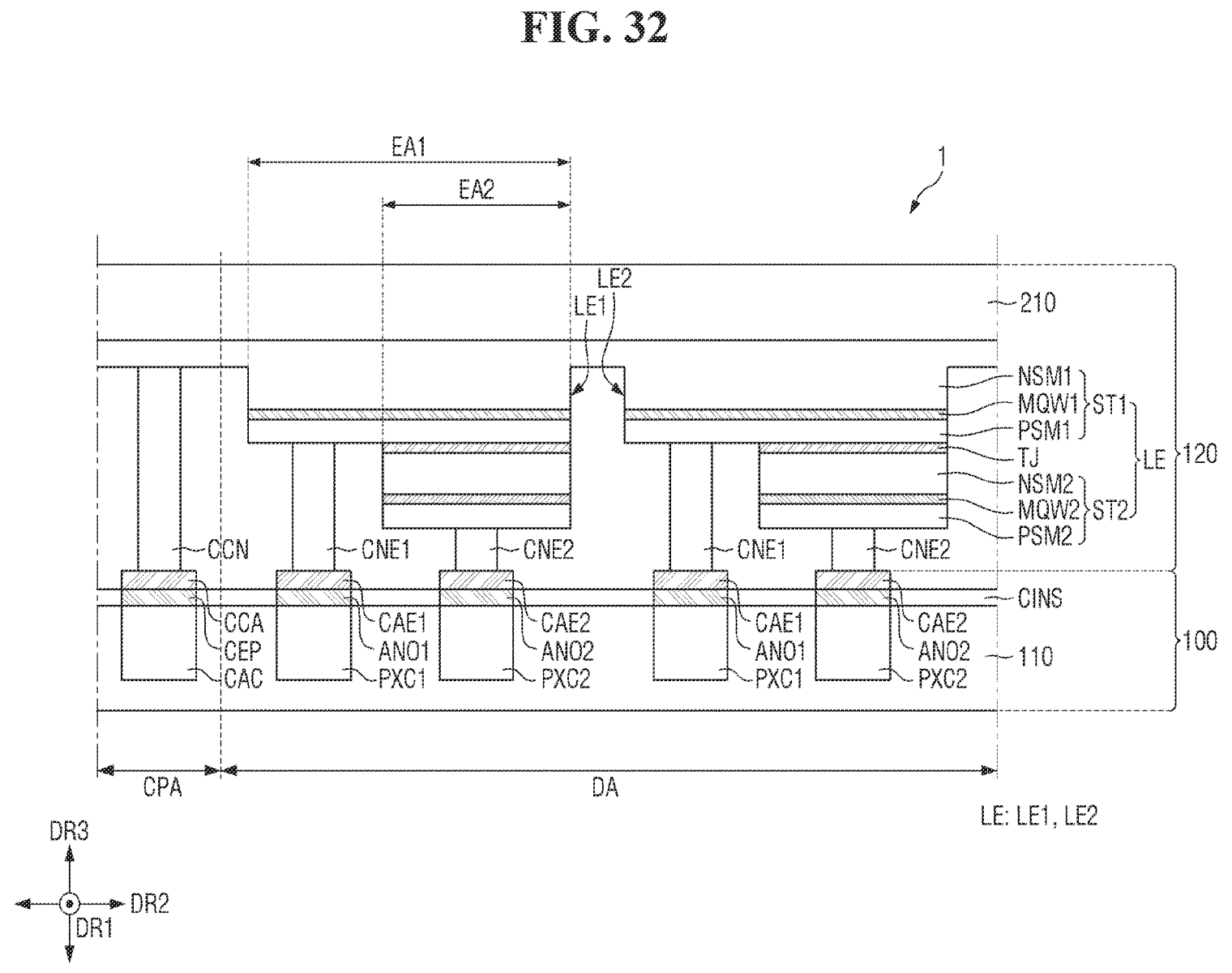

Referring to FIGS. 31 and 32, the semiconductor circuit substrate 100 is first prepared. The semiconductor circuit substrate 100 includes the first substrate 110, the pixel circuit parts PXC1 and PXC2, the common circuit part CAC, the pixel electrodes ANO1 and ANO2, the common electrode CEP, the contact electrodes CAE1 and CAE2, and the circuit insulating layer CINS.

For example, the pixel electrodes ANO1 and ANO2 and the common electrode CEP are formed on the first substrate 110 in which the plurality of pixel circuit parts PXC are formed, and the circuit insulating layer CINS for planarizing a step of the plurality of pixel circuit parts PXC1 and PXC2 and the common circuit part CAC is formed. Then, a contact electrode material layer is stacked on the pixel electrodes ANO1 and ANO2 and the common electrode CEP and is etched to form the contact electrodes CAE1 and CAE2 and the common contact electrode CCA. The contact electrode material layer may include gold (Au), copper (Cu), aluminum (Al), and/or tin (Sn).

Next, the light emitting element layer 120 is aligned on and with the semiconductor circuit substrate 100, and the semiconductor circuit substrate 100 and the light emitting element layer 120 are then bonded to each other.

For example, the contact electrodes CAE1 and CAE2 of the semiconductor circuit substrate 100 and the connection electrodes CNE1 and CNE2 of the light emitting element layer 120 are brought into contact with each other. In addition, the common contact electrode CCA and the common connection electrode CCN are brought into contact with each other. Then, the semiconductor circuit substrate 100 and the light emitting element layer 120 are bonded to each other by, for example, fusion-bonding the contact electrodes CAE1 and CAE2, the connection electrodes CNE1 and CNE2, the common contact electrode CCA, and the common connection electrode CCN to each other at a set or predetermined temperature. Accordingly, the display device 1 according to one or more embodiments is manufactured.

As described above, in the display device 1 according to the embodiment, it is possible to allow the respective stacks ST1 and ST2 of the respective light emitting elements LE1 and LE2 to individually or simultaneously (or concurrently) emit the light by providing the tunnel functional layer TJ between a plurality of stacks ST1 and ST2 of the respective light emitting elements LE1 and LE2 to enable the movement of the electrons and the holes between the stacks ST1 and ST2. Accordingly, two light emitting elements LE1 and LE2 emit the blue light, the green light, and the red light, such that the number of sub-pixels may be decreased and one pixel PX may be constituted (e.g., formed) by the decreased number of sub-pixels. Therefore, a structure of the display device 1 and processes of manufacturing the display device 1 may be simplified, and the display device 1 having a high resolution may be implemented.

In addition, it is possible to allow the plurality of stacks ST1 and ST2 to individually or simultaneously (or concurrently) emit the light by providing the connection electrodes CNE1 and CNE2 on the plurality of stacks ST1 and ST2 of the respective light emitting elements LE1 and LE2, respectively. In addition, it is possible to implement a full color by adjusting the periods in which the currents are applied to the respective stacks ST1 and ST2 to express gradations.

Figure 33:
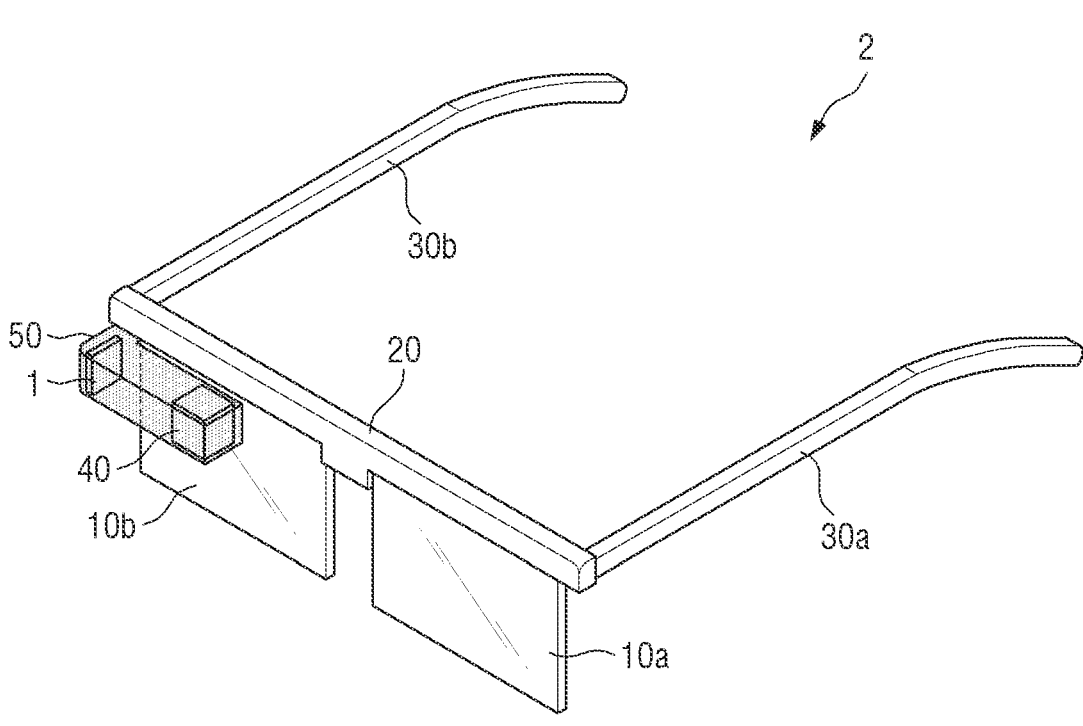
FIG. 33 is an illustrative view illustrating a virtual reality device including the display device according to one or more embodiments.

FIG. 33 is an illustrative view illustrating a virtual reality device including the display device according to one or more embodiments. FIG. 33 illustrates a virtual reality device 2 to which the display device 1 according to one or more embodiments is applied.

Referring to FIG. 33, the virtual reality device 2 according to one or more embodiments may be a glasses-type (glasses-like) device. The virtual reality device 2 according to one or more embodiments may include the display device 1, a left eye lens 10a, a right eye lens 10b, a support frame 20, eyeglass frame legs 30a and 30b, a reflective member 40, and a display device accommodating part 50.

The virtual reality device 2 including the eyeglass frame legs 30a and 30b has been illustrated in FIG. 33, but the virtual reality device 2 according to one or more embodiments may also be applied to a head mounted display including a head mounted band that may be mounted on a user's head instead of the eyeglass frame legs 30a and 30b. For example, the virtual reality device 2 according to one or more embodiments is not limited to that illustrated in FIG. 33, and may be applied in various suitable forms to various other suitable electronic devices.

The display device accommodating part 50 may include the display device 1 and the reflective member 40. An image displayed on the display device 1 may be reflected by the reflective member 40 and provided to a user's right eye through the right eye lens 10*b*. Accordingly, a user may view a virtual reality image displayed on the display device 1 through his/her right eye.

It has been illustrated in FIG. 33 that the display device accommodating part 50 is at a right distal end of the support frame 20, but one or more embodiments of the present disclosure is not limited thereto. For example, the display device accommodating part 50 may be at a left distal end of the support frame 20. In this case, an image displayed on the display device 1 may be reflected by the reflective member 40 and provided to a user's left eye through the left eye lens 10*a*. Accordingly, the user may view a virtual reality image displayed on the display device 1 through his/her left eye. In one or more embodiments, the display device accommodating parts 50 may be at both the left and right distal ends of the support frame 20. In this case, the user may view a virtual reality image displayed on the display device 1 through both his/her left and right eyes.

Figure 34:
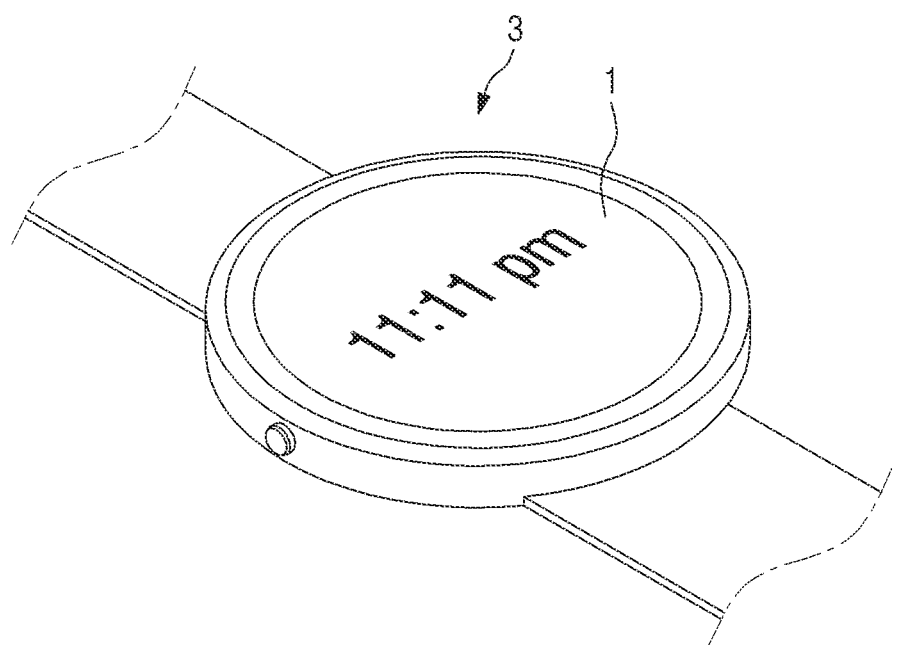
FIG. 34 is an illustrative view illustrating a smart device including the display device according to one or more embodiments.

FIG. 34 is an illustrative view illustrating a smart device including the display device according to one or more embodiments.

Referring to FIG. 34, the display device 1 according to one or more embodiments may be applied to a smartwatch 3, which is one of the smart devices.

Figure 35:
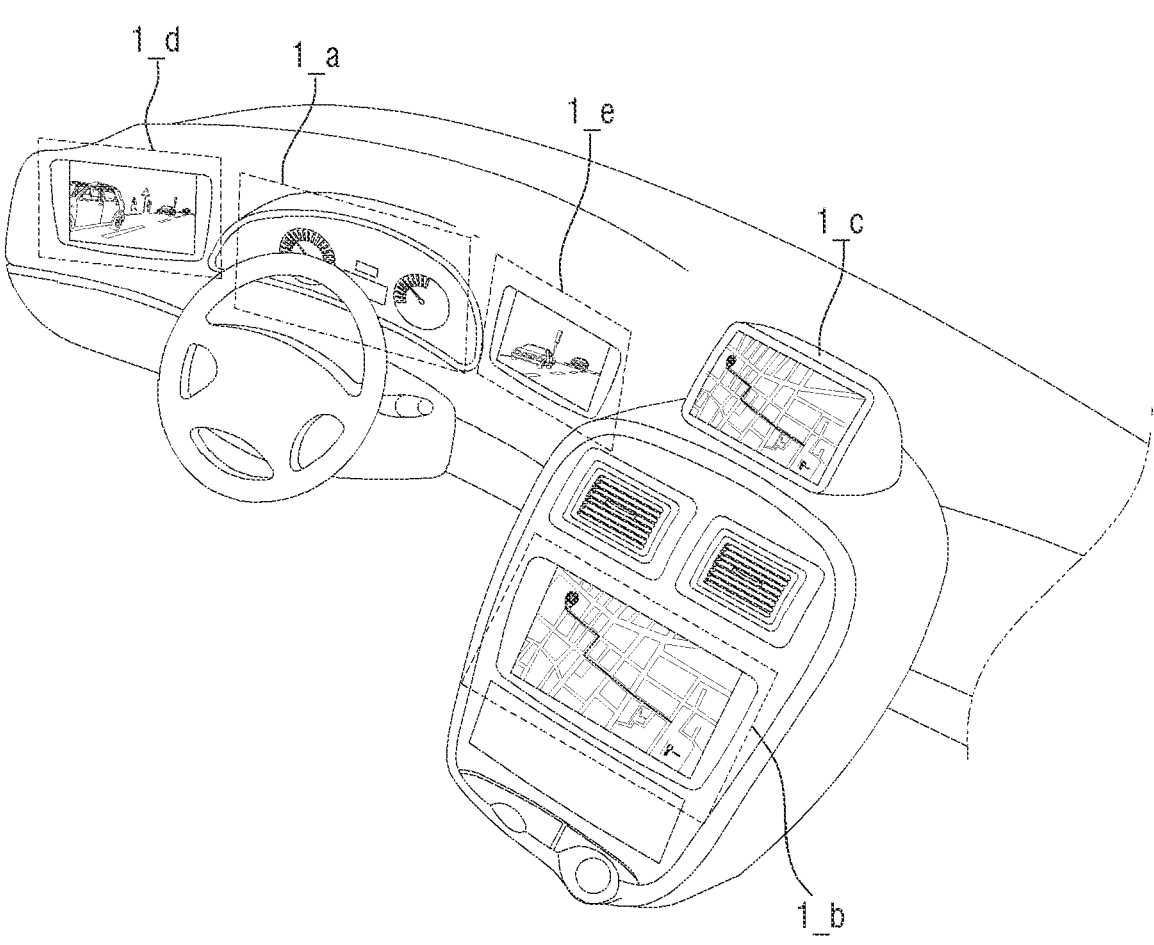
FIG. 35 is an illustrative view illustrating an instrument board and a center fascia of a vehicle including the display device according to one or more embodiments.

FIG. 35 is an illustrative view illustrating a vehicle including the display device according to one or more embodiments. A vehicle to which the display device 1 according to one or more embodiments is applied is illustrated in FIG. 35.

Referring to FIG. 35, display devices 1_*a*, 1_*b*, or 1_*c* according to one or more embodiments may be applied to an instrument board of the vehicle, applied to a center fascia of the vehicle, or applied to a center information display (CID) on a dashboard of the vehicle. In addition, display devices 1_*d* and 1_*e* according to one or more embodiments may be applied to room mirror displays substituting for side mirrors of the vehicle.

Figure 36:
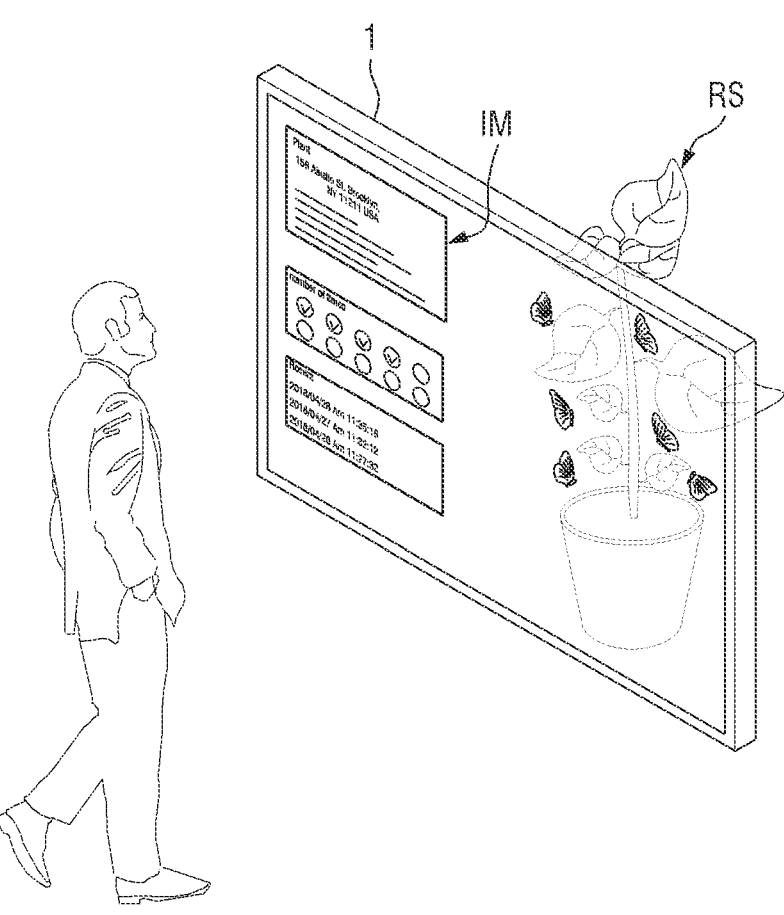
FIG. 36 is an illustrative view illustrating a transparent display device including the display device according to one or more embodiments.

FIG. 36 is an illustrative view illustrating a transparent display device including the display device according to one or more embodiments.

Referring to FIG. 36, the display device 1 according to one or more embodiments may be applied to a transparent display device. The transparent display device may transmit light while displaying an image IM. Therefore, a user positioned on a front surface of the transparent display device may not only view the image IM displayed on the display device 1, but also see an object RS or a background positioned on a rear surface of the transparent display device. When the display device 1 is applied to the transparent display device, the semiconductor circuit substrate 100 of the display device 1 illustrated in FIG. 4 may include a light transmitting part capable of transmitting light or may be made of a material capable of transmitting light.

In concluding the detailed description, those skilled in the art will appreciate that many variations and modifications can be made to the present embodiments without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A display device comprising:

a substrate;

a plurality of pixel electrodes on the substrate; and a plurality of light emitting elements on the plurality of pixel electrodes, wherein the plurality of light emitting elements comprise a first light emitting element and a second light emitting element, and each of the first light emitting element and the second light emitting element comprises:

a first stack configured to emit a first light;

a second stack below the first stack and configured to emit a second light or a third light; and tunnel functional layers between the first stack and the second stack, wherein the first stack comprises a first active layer configured to emit the first light, and the second stack comprises a second active layer configured to emit the second light or the third light, wherein the first stack comprises a first n-type semiconductor layer and a first p-type semiconductor layer spaced apart from each other with the first active layer therebetween, and the second stack comprises a second n-type semiconductor layer and a second p-type semiconductor layer spaced apart from each other with the second active layer therebetween, and wherein the tunnel functional layers are between the first stack and the second stack, and comprise a first tunnel layer comprising an n-type semiconductor, a second tunnel layer comprising an n-type semiconductor, and a third tunnel layer comprising a p-type semiconductor.

2. The display device of claim 1, wherein the first light is blue light, the second light is red light, and the third light is green light.

3. The display device of claim 1, wherein the second tunnel layer is between the first tunnel layer and the third tunnel layer, and has a thickness smaller than a thickness of the first tunnel layer and a thickness of the third tunnel layer.

4. The display device of claim 1, wherein a concentration of a p-type dopant doped in the third tunnel layer is lower than a concentration of an n-type dopant doped in the first tunnel layer and a concentration of an n-type dopant doped in the second tunnel layer.

5. The display device of claim 1, wherein the first tunnel layer of the tunnel functional layer is in contact with the first p-type semiconductor layer of the first stack, and the third tunnel layer of the tunnel functional layer is in contact with the second n-type semiconductor layer of the second stack.

6. The display device of claim 1, wherein the first n-type semiconductor layer of the first stack is a common layer continuous in the plurality of light emitting elements.

7. The display device of claim 1, further comprising a plurality of connection electrodes connecting the plurality of pixel electrodes and the plurality of light emitting elements to each other, wherein the plurality of connection electrodes comprise:

a first connection electrode connected to the first p-type semiconductor layer of the first stack;

a second connection electrode connected to the second p-type semiconductor layer of the second stack; and a common connection electrode connected to the first n-type semiconductor layer of the first stack.

8. The display device of claim 7, wherein the first stack is configured to emit the first light according to a first driving current applied to the first connection electrode and the common connection electrode, and the second stack is configured to emit the second light or the third light according to a second driving current applied to the first connection electrode and the second connection electrode.

9. The display device of claim 8, wherein each of a content of indium in the second active layer of the first light emitting element and a content of indium in the second active layer of the second light emitting element is 30% to 45%, and a current density of the second driving current configured to emit the second light is lower than a current density of the second driving current configured to emit the third light.

10. A display device comprising:

a substrate;

a plurality of pixel electrodes on the substrate; and a plurality of light emitting elements on the plurality of pixel electrodes, wherein the plurality of light emitting elements comprise:

a first light emitting element comprising active layers each configured to emit different light; and a second light emitting element and a third light emitting element comprising active layers each configured to emit different light or the same light, and each of the first light emitting element, the second light emitting element, and the third light emitting element further comprises a tunnel functional layer between the active layers, wherein the first light emitting element comprises a first active layer configured to emit a first light and a second active layer configured to emit a second light, the first light is blue light, and the second light is red light, wherein each of the second light emitting element and the third light emitting element comprises a third active layer configured to emit the second light or a third light, and a second active layer configured to emit the second light or the third light, and wherein the tunnel functional layer is between the first active layer and the second active layer of the first light emitting element, and between the second active layer and the third active layer of the second light emitting element, the tunnel functional layer comprising a first tunnel layer comprising an n-type semiconductor, a second tunnel layer comprising an n-type semiconductor, and a third tunnel layer comprising a p-type semiconductor.

11. The display device of claim 10, wherein the third active layer of each of the second light emitting element and the third light emitting element is configured to emit the second light or the third light, and the second active layer of each of the second light emitting element and the third light emitting element is configured to emit the second light.

12. The display device of claim 11, wherein each of a content of indium in the second active layer and a content of indium in the third active layer is 30% to 45%.

13. The display device of claim 10, wherein the second tunnel layer is between the first tunnel layer and the third tunnel layer and has a thickness smaller than a thickness of the first tunnel layer and a thickness of the third tunnel layer, and a concentration of a p-type dopant doped in the third tunnel layer is lower than a concentration of an n-type dopant doped in the first tunnel layer and a concentration of an n-type dopant doped in the second tunnel layer.

14. A display device comprising:

a substrate;

a plurality of pixel electrodes on the substrate; and a plurality of light emitting elements on the plurality of pixel electrodes, wherein the plurality of light emitting elements comprise:

a first light emitting element comprising a first stack configured to emit a first light, a second stack configured to emit the first light, and tunnel functional layers between the first stack and the second stack;

a second light emitting element configured to emit a second light; and a third light emitting element configured to emit a third light, wherein the tunnel functional layer comprises a first tunnel layer comprising an n-type semiconductor, a second tunnel layer comprising an n-type semiconductor, and a third tunnel layer comprising a p-type semiconductor, the second tunnel layer is between the first tunnel layer and the third tunnel layer and has a thickness smaller than a thickness of the first tunnel layer and a thickness of the third tunnel layer, and a concentration of a p-type dopant doped in the third tunnel layer is lower than a concentration of an n-type dopant doped in the first tunnel layer and a concentration of an n-type dopant doped in the second tunnel layer.

15. The display device of claim 14, wherein the first light emitting element comprises a first active layer configured to emit the first light and a second active layer configured to emit the second light, the second light emitting element comprises a third active layer configured to emit the second light, the third light emitting element comprises a fourth active layer configured to emit the third light, and wherein the first light is red light, the second light is green light, and the third light is blue light.

* * * * *